United States Patent [19]

Yoshizawa

[11] Patent Number: 5,838,196
[45] Date of Patent: Nov. 17, 1998

[54] TRANSFORMER-COUPLED AMPLIFIER

[75] Inventor: Yasuo Yoshizawa, Yamagata-ken, Japan

[73] Assignee: Yoshiki Industrial Co., Ltd., Yamagata-Ken, Japan

[21] Appl. No.: 847,769

[22] Filed: Apr. 23, 1997

[30] Foreign Application Priority Data

Apr. 26, 1996 [JP] Japan .................................. 8-106610

[51] Int. Cl.⁶ .................................................. H03F 3/30
[52] U.S. Cl. .......................... 330/188; 330/122; 330/146; 330/269; 330/276
[58] Field of Search ............................. 330/8, 118, 122, 330/146, 188, 189, 264, 269, 276

[56] References Cited

U.S. PATENT DOCUMENTS 5,422,599  6/1995  Larsen ..................................... 330/196

FOREIGN PATENT DOCUMENTS 32-10413  12/1957  Japan .
58-196705  11/1983  Japan .

Primary Examiner—James B. Mullins
Attorney, Agent, or Firm—John P. White; Cooper & Dunham LLP

[57] ABSTRACT

A transformer-coupled amplifier includes a driver transformer in which a primary winding, a secondary winding, and a tertiary winding are wound on a core of a magnetic circuit, a drive signal source for supplying an AC drive signal superposed with a drive-stage DC current to the primary winding of the driver transformer, a power tube for extracting, from the secondary winding of the driver transformer, an AC signal corresponding to the AC drive signal supplied to the primary winding of the driver transformer, and for amplifying the AC signal from the secondary winding, and a DC magnetization control power source for supplying a predetermined magnetization control current to the tertiary winding of the driver transformer so as to change a degree of DC magnetization of the core of the magnetic circuit of the driver transformer. The DC magnetized state of the core of the transformer magnetized by the DC current is appropriately changed by the magnetization control current.

18 Claims, 12 Drawing Sheets

TRANSFORMER-COUPLED AMPLIFIER

BACKGROUND OF THE INVENTION

The present invention relates to an improvement of a transformer-coupled amplifier using an AC signal transmission transformer in part of a signal path.

Several methods are available to use a single-end drive signal source and drive an output stage through a signal transmission transformer.

The first method proposes a transformer driver circuit (hereinafter referred to as a Clarf scheme). In this driver circuit, a DC current is not flowed to the primary side of a coupling transformer (signal transmission transformer), and the primary side is indirectly AC-driven by a preamplifier element (e.g., a vacuum tube), and an output amplifier element (e.g., a vacuum tube) excitation AC signal (AC voltage or current) is extracted from the secondary side of the coupling transformer.

The second method proposes a transformer driver circuit (tentatively called a direct drive scheme). In this driver circuit, a DC current is flowed to the primary side of a coupling transformer-to cause a preamplifier element (e.g., a vacuum tube) to directly drive the primary side, and an output amplifier element (e.g., a vacuum tube) excitation AC signal (AC voltage or current) is extracted from the secondary side of the coupling transformer.

According to the Clarf scheme, the plate current of the pre-stage vacuum tube is AC-connected to the primary winding of the coupling transformer through a coupling capacitor so as to prevent the plate current of the pre-stage vacuum tube from flowing to the primary winding of the coupling transformer. With this arrangement, the coupling transformer is not DC-magnetized by the plate current of the pre-stage vacuum tube. A gap for preventing DC magnetic saturation need not be formed in the magnetic circuit (constituted by a high-permeability magnetic material such as a directional silicon steel plate or permalloy) of the coupling transformer.

When a gap-free magnetic circuit is formed using a high-permeability magnetic material, the magnetic resistance of the magnetic circuit becomes very low, and a large primary inductance can be obtained even with a compact magnetic circuit and a small number of turns of the primary winding. Since the relatively large primary inductance is obtained, a wide-range transformer having a wide transmission band width can be obtained with the compact magnetic circuit and the winding arrangement having a small number of turns (when the winding arrangement becomes large, higher-frequency response characteristics tend to be degraded).

Although the Clarf scheme has the above merits, a DC cut coupling capacitor must be inevitably inserted between the pre-stage driver circuit and the primary winding of the coupling transformer, and the following problem is therefore posed.

A series resonance circuit is formed by the coupling capacitor and the primary winding inductance of the transformer, and a peak is undesirably formed on the low-frequency side. Although this low-frequency peak (frequency response) can be apparently suppressed or damped by circuit design, the series resonance circuit which causes the low-frequency peak does not disappear, and the transient response near the resonance frequency (low-frequency peak point) tends to be degraded (the auditory influence of this transient response varies depending on the characteristics of a speaker system used).

The primary side of the coupling transformer is driven through the coupling capacitor whose impedance increases at low frequencies, and low-frequency energies are not sufficiently transferred to the coupling transformer. As a result, an auditory strength tends not to be obtained in the low- and intermediate-frequency components (the strength does not mean massiveness due to the low-frequency peak).

In the direct drive scheme, however, since the coupling transformer is directly driven without going through the coupling capacitor whose impedance increases at low frequencies. The energies up to the low-frequency energy can be sufficiently transferred to the coupling transformer. As a result, an auditory strength can be obtained in the low- and intermediate-frequency components.

In the direct drive scheme, however, the plate current of the pre-stage vacuum tube flows in the primary winding of the coupling transformer, and a gap must be formed in the magnetic circuit of the coupling transformer to prevent DC magnetic saturation.

When the gap is formed in the magnetic circuit, the magnetic resistance of the magnetic circuit increases. It becomes difficult to assure a large primary inductance even with use of a large magnetic circuit. When the primary inductance is kept small, the low-frequency response of the amplifier including the coupling transformer is degraded. For this reason, a primary inductance having a value equal to or larger than a predetermined value is required (the low-frequency response of the transformer is changed not only by the primary inductance but also by the impedance of a drive source, provided that the impedance of the drive source is assumed constant). To increase the primary inductance, the number of turns of the primary winding of the coupling transformer inevitably increases, and the high-frequency response of the coupling transformer tends to be degraded.

To increase the primary inductance to a value equal to or larger than the predetermined value without much increasing the number of turns of the primary winding of the coupling transformer in the direct drive scheme, the core of a magnetic circuit which has a large cross-section enough to cancel, to some extent, the magnetic resistance component caused by the gap is required. Therefore, the core of the coupling transformer becomes bulky.

To obtain the wide-band frequency response characteristics equivalent to the Clarf scheme in the direct drive scheme, an advanced winding technique is required to assure high-frequency characteristics, and at the same time, the coupling transformer itself becomes bulky and large in weight to a considerably degree to assure low-frequency characteristics.

BRIEF SUMMARY OF THE INVENTION

It is an object of the present invention to provide a transformer-coupled amplifier capable of improving amplifier characteristics such as a frequency response without increasing the size of the core of a magnetic circuit, by controlling the DC magnetized state of the core of the magnetic circuit of a coupling transformer (driver transformer) in the transformer-coupled amplifier.

In order to achieve the above object according to the first aspect of the present invention, there is provided a transformer-coupled amplifier comprising: a driver transformer in which a primary winding, a secondary winding, and a tertiary winding are wound on a core of a magnetic circuit; a drive signal source for supplying an AC drive signal superposed with a drive-stage DC current to the primary winding of the driver transformer; output means for extracting, from the secondary winding of the driver transformer, an AC signal corresponding to the AC drive signal supplied to the primary winding of the driver transformer, and for amplifying the AC signal from the secondary winding; and DC magnetization control means for supplying a predetermined magnetization control current to the tertiary winding of the driver transformer so as to change a degree of DC magnetization of the core of the magnetic circuit of the driver transformer.

This amplifier is arranged such that the DC magnetized state of the core of the magnetic circuit of the driver transformer magnetized by the drive-stage DC current is changed by the magnetization control current so as to obtain a predetermined state.

In order to achieve the above object according to the second aspect of the present invention, there is provided a transformer-coupled amplifier comprising: a driver transformer in which a primary winding, a secondary winding, and a tertiary winding are wound on a core of a magnetic circuit; a drive signal source for supplying an AC drive signal superposed with a drive-stage DC current to the primary winding of the driver transformer; output means for extracting, from the secondary winding of the driver transformer, an AC signal corresponding to the AC drive signal supplied to the primary winding of the driver transformer, and for amplifying the AC signal from the secondary winding; and DC magnetization control means for supplying a predetermined magnetization control current to the tertiary winding of the driver transformer so as to change a degree of DC magnetization of the core of the magnetic circuit of the driver transformer, the DC magnetization control means having a predetermined internal impedance.

In the above amplifier, the DC magnetization control current is flowed to the tertiary winding of the driver transformer so as to obtain a state in which the degree of DC magnetization of the core of the magnetic circuit of the drive transformer is reduced. At the same time, the magnitude of the magnetization control current flowing in the tertiary winding of the driver transformer and the internal impedance of the DC magnetization control means are selected such that the amplifier characteristics including the frequency response characteristics of the primary and secondary windings of the driver transformer are set to predetermined characteristics.

In order to achieve the above object according to the third aspect of the present invention, there is provided a transformer-coupled amplifier comprising: a driver transformer in which a primary winding, a first secondary winding, a second secondary winding, and a tertiary winding are wound on a core of a magnetic circuit; a drive signal source for supplying an AC drive signal superposed with a drive-stage DC current to the primary winding of the driver transformer; first output means for extracting, from the first secondary winding of the driver transformer, a first AC signal corresponding to the AC drive signal supplied to the primary winding of the driver transformer, and for amplifying the first AC signal from the first secondary winding; second output means for extracting, from the second secondary winding of the driver transformer, a second AC signal having a phase opposite to that of the first AC signal and corresponding to the AC drive signal supplied to the primary winding of the driver transformer, and for amplifying the second AC signal from the second secondary winding; output synthesizing means for synthesizing and outputting a first output from the first output means which has amplified the first AC signal and a second output from the second output means which has amplified the second AC signal; and DC magnetization control means for providing a predetermined magnetization control current to the tertiary winding of the driver transformer so as to change a degree of DC magnetization of the core of the magnetic circuit of the driver transformer.

The above amplifier is arranged such that the DC magnetized state of the core of the magnetic circuit of the driver transformer magnetized by the drive-stage DC current is changed by the magnetization control current so as to obtain a predetermined state.

In order to achieve the above object according to the fourth aspect of the present invention, there is provided a transformer-coupled amplifier comprising: a driver transformer in which a primary winding, a first secondary winding, a second secondary winding, and a tertiary winding are wound on a core of a magnetic circuit; a drive signal source for supplying an AC drive signal superposed with a drive-stage DC current to the primary winding of the driver transformer; first output means for extracting, from the first secondary winding of the driver transformer, a first AC signal corresponding to the AC drive signal supplied to the primary winding of the driver transformer, and for amplifying the first AC signal from the first secondary winding; second output means for extracting, from the second secondary winding of the driver transformer, a second AC signal having a phase opposite to that of the first AC signal and corresponding to the AC drive signal supplied to the primary winding of the driver transformer, and for amplifying the second AC signal from the second secondary winding; output synthesizing means for synthesizing and outputting a first output from the first output means which has amplified the first AC signal and a second output from the second output means which has amplified the second AC signal; and DC magnetization control means for providing a predetermined magnetization control current to the tertiary winding of the driver transformer so as to change a degree of DC magnetization of the core of the magnetic circuit of the driver transformer.

In the above amplifier, the DC magnetization control current is flowed to the tertiary winding of the driver transformer so as to obtain a state in which the degree of DC magnetization of the core of the magnetic circuit of the drive transformer is reduced. At the same time, the magnitude of the magnetization control current flowing in the tertiary winding of the driver transformer and the internal impedance of the DC magnetization control means are selected such that the amplifier characteristics including the frequency response characteristics of the primary and secondary windings of the driver transformer are set to predetermined characteristics.

In order to achieve the above object according to the fifth aspect of the present invention, there is provided a transformer-coupled amplifier comprising: a driver transformer in which a primary winding, a secondary winding, and a tertiary winding are wound on a core of a magnetic circuit; a drive signal source for supplying an AC drive signal superposed with a drive-stage DC current to the primary winding of the driver transformer; output means for extracting, from the secondary winding of the driver transformer, an AC signal corresponding to the AC drive signal supplied to the primary winding of the driver transformer, and for amplifying the AC signal from the secondary winding; bias means for supplying a DC bias current to the output means through the secondary winding of the driver transformer in a direction to reduce a degree of DC magnetization of the core of the magnetic circuit magnetized by the drive-stage DC current flowed in the primary winding of the driver transformer; and DC magnetization control means for supplying a predetermined magnetization control current to the tertiary winding of the driver transformer so as to change the degree of DC magnetization of the core of the magnetic circuit of the driver transformer.

The above amplifier is arranged such that the DC magnetized state of the core of the magnetic circuit of the driver transformer magnetized by the drive-stage DC current is changed by the magnetization control current and the DC bias current so as to obtain a predetermined. state.

More specifically, according to the arrangement of the above amplifier, the DC magnetized state of the magnetic circuit core which remains upon reduction of DC magnetization of the core of the magnetic circuit magnetized by the drive-stage DC current is canceled or adjusted by the magnetization control current.

In order to achieve the above object according to the sixth aspect of the present invention, there is provided a transformer-coupled amplifier comprising: a driver transformer in which a primary winding, a secondary winding, and a tertiary winding are wound on a core of a magnetic circuit; a drive signal source for supplying an AC drive signal superposed with a drive-stage DC current to the primary winding of the driver transformer; output means for extracting, from the secondary winding of the driver transformer, an AC signal corresponding to the AC drive signal supplied to the primary winding of the driver transformer, and for amplifying the AC signal from the secondary winding; bias means for supplying a DC bias current to the output means through the secondary winding of the driver transformer in a direction to reduce a degree of DC magnetization of the core of the magnetic circuit magnetized by the drive-stage DC current flowed in the primary winding of the driver transformer; and DC magnetization control means for supplying a predetermined magnetization control current to the tertiary winding of the driver transformer so as to change the degree of DC magnetization of the core of the magnetic circuit of the driver transformer.

In the above amplifier, the magnitude of the magnetization control current flowing in the tertiary winding of the driver transformer and the internal impedance of the DC magnetization control means are selected such that the amplifier characteristics including the frequency response characteristics of the primary and secondary windings of the driver transformer are set to predetermined characteristics.

In order to achieve the above object according to the seventh aspect of the present invention, there is provided a transformer-coupled amplifier comprising: a driver transformer in which a primary winding, a first secondary winding, a second secondary winding, and a tertiary winding are wound on a core of a magnetic circuit; a drive signal source for supplying an AC drive signal superposed with a drive-stage DC current to the primary winding of the driver transformer; first output means for extracting, from the first secondary winding of the driver transformer, a first AC signal corresponding to the AC drive signal supplied to the primary winding of the driver transformer, and for amplifying the first AC signal from the first secondary winding; second output means for extracting, from the second secondary winding of the driver transformer, a second AC signal having a phase opposite to the first AC signal and corresponding to the AC drive signal supplied to the primary winding of the driver transformer, and for amplifying the second AC signal from the second secondary winding; output synthesizing means for synthesizing and outputting a first output from the first output means which has amplified the first AC signal and a second output from the second output means which has amplified the second AC signal; bias means for supplying a first DC bias current to the first output means through the first secondary winding of the driver transformer and a second DC bias current to the second output means through the second secondary winding of the driver transformer; and DC magnetization control means for providing a predetermined magnetization control current to the tertiary winding of the driver transformer so as to change a degree of DC magnetization of the core of the magnetic circuit of the driver transformer.

The above amplifier is arranged such that the DC magnetized state of the core of the magnetic circuit of the driver transformer magnetized by the drive-stage DC current is changed by the magnetization control current so as to obtain a predetermined state.

More specifically, DC magnetization of the core of the magnetic circuit by the drive-stage DC current, which remains even after magnetization of the core of the magnetic circuit by the grid current of the first power tube is canceled by the grid current of the second power tube, can be canceled by the magnetization control current.

In order to achieve the above object according to the eighth aspect of the present invention, there is provided a transformer-coupled amplifier comprising: a driver transformer in which a primary winding, a first secondary winding, a second secondary winding, and a tertiary winding are wound on a core of a magnetic circuit; a drive signal source for supplying an AC drive signal superposed with a drive-stage DC current to the primary winding of the driver transformer; first output means for extracting, from the first secondary winding of the driver transformer, a first AC signal corresponding to the AC drive signal supplied to the primary winding of the driver transformer, and for amplifying the first AC signal from the first secondary winding; second output means for extracting, from the second secondary winding of the driver transformer, a second AC signal having a phase opposite to the first AC signal and corresponding to the AC drive signal supplied to the primary winding of the driver transformer, and for amplifying the second AC signal from the second secondary winding; output synthesizing means for synthesizing and outputting a first output from the first output means which has amplified the first AC signal and a second output from the second output means which has amplified the second AC signal; bias means for supplying a first DC bias current to the first output means through the first secondary winding of the driver transformer and a second DC bias current to the second output means through the second secondary winding of the driver transformer; and DC magnetization control means for providing a predetermined magnetization control current to the tertiary winding of the driver transformer so as to change a degree of DC magnetization of the core of the magnetic circuit of the driver transformer.

In the above amplifier, the magnitude of the magnetization control current flowing in the tertiary winding of the driver transformer and the internal impedance of the DC magnetization control means are selected such that the amplifier characteristics including the frequency response characteristics of the primary and secondary windings of the driver transformer are set to predetermined characteristics.

More specifically, DC magnetization of the core of the magnetic circuit by the drive-stage DC current, which remains even after magnetization of the core of the magnetic circuit by the grid current of the first power tube is canceled by the grid current of the second power tube, can be canceled by the magnetization control current. At the same time, the frequency response characteristics of the amplifier including the driver transformer can be adjusted by the power source impedance of the magnetization control current.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawing, which are incorporated in and constitutes a part of the specification, illustrates presently preferred embodiments of the invention, and together with the general description given above and the detailed description of the preferred embodiments given below, serves to explain the principles of the invention.

DETAILED DESCRIPTION OF THE INVENTION

Figure 1:
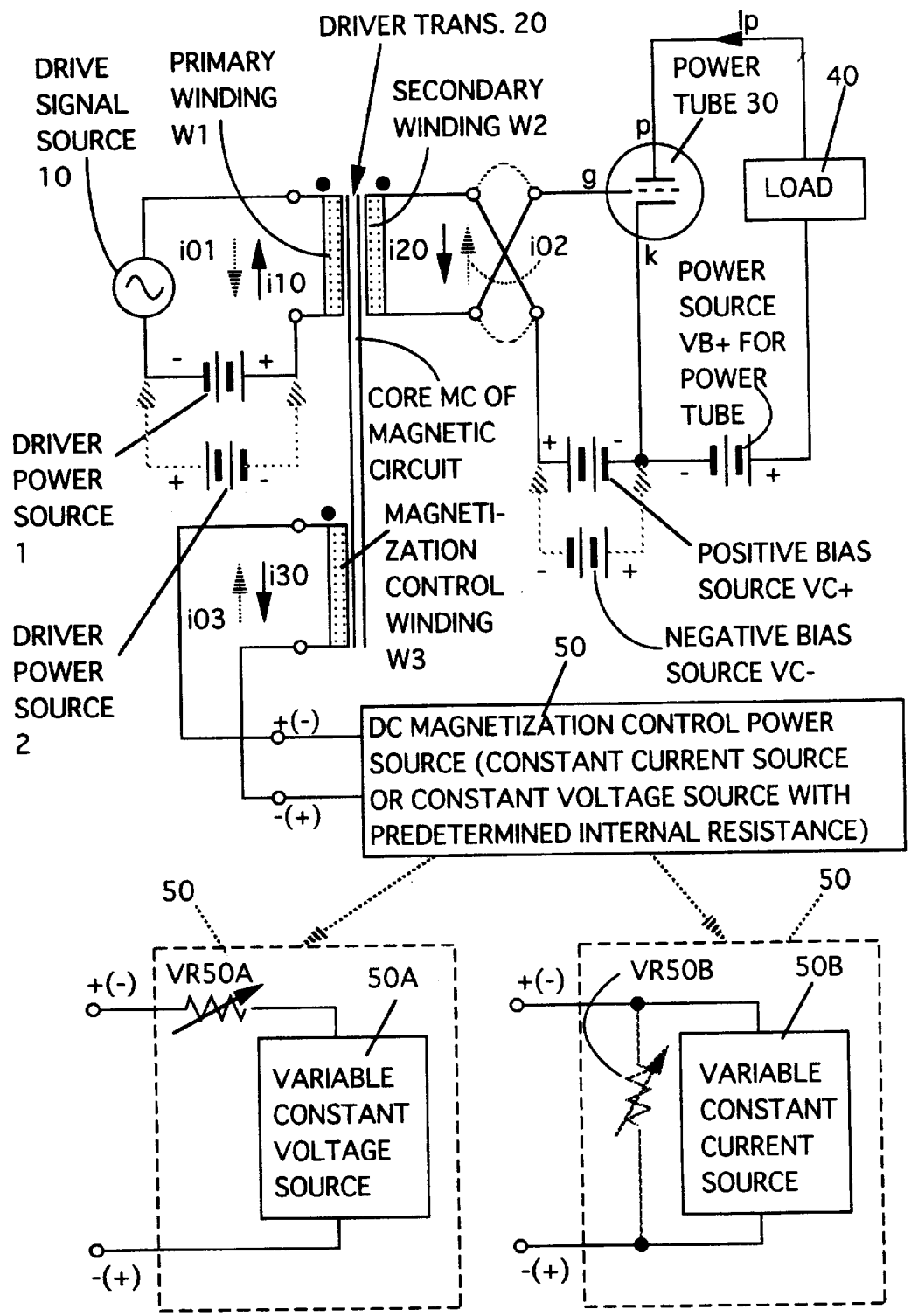
FIG. 1 is a circuit diagram showing the schematic arrangement of a transformer-coupled amplifier (single amplifier) according to an embodiment of the present invention.

A transformer-coupled amplifier according to an embodiment of the present invention will be described with reference to the accompanying drawings. The same reference numerals denote the same parts and functions throughout a plurality of drawings.

FIG. 1 is a circuit diagram for explaining the schematic arrangement of the transformer-coupled amplifier (single amplifier) according to an embodiment of the present invention.

One terminal of drive signal source 10 for generating an AC drive signal superposed with DC current i10 (or i01) is connected to the hot side (black dot mark) of primary winding W1 of driver transformer (coupling transformer) 20. The other terminal of signal source 10 is connected to the cold side of driver transformer 20 through driver power source 1 (or driver power source 2).

When power tube 30 is a positive grid bias tube, the hot side (black dot mark) of secondary winding W2 of driver transformer 20 is connected to positive bias source VC+, and the cold side of secondary winding W2 of transformer 20 is connected to control grid g of power tube 30. In this case, grid current i20 of power tube 30 flows from positive bias source VC+ in a direction of an arrow indicated by a solid line. A degree of DC magnetization of core MC of the magnetic circuit of transformer 20 by primary winding current i10 of transformer 20 is reduced or canceled by grid current i20 of power tube 30.

The primary side of transformer 20 is connected to driver power source 2. When primary winding current i01 flows in a direction of an arrow indicated by a broken line, the secondary winding of transformer 20 is changed indicated by a broken line to reduce or cancel DC magnetization of core MC of the magnetic circuit of transformer 20 so as to flow secondary current i02 of transformer 20 in the direction of the arrow indicated by the broken line.

When power tube 30 is a negative grid bias tube, the hot side (black dot mark) of secondary winding WE2 of driver transformer 20 is connected to negative bias source VC−, and the cold side of secondary winding W2 of secondary winding W2 of transformer 20 is connected to control grid g of power tube 30. No grid current flows when power tube 30 is normal. Therefore, DC magnetization of core MC of the magnetic circuit of transformer 20 by primary winding current i10 of transformer 20 remains.

When the secondary winding of transformer 20 is connected as indicated by the solid line (opposite-phase connection), the AC component of drive signal source 10 which has passed through transformer 20 is phase-inverted and transmitted to grid g of power tube 30. When the secondary winding of transformer 20, however, is connected as indicated by the broken line (in-phase connection), the AC component of drive signal source 10 which has passed through transformer 20 is transmitted in phase to grid g of power tube 30.

When a secondary distortion having a phase opposite to that of power tube 30 is generated by drive signal source 10, the secondary distortion cancellation (reduction) action of power tube 30 is obtained by the above in-phase connection. When a secondary distortion in phase with power tube 30 is generated by drive signal source 10, the secondary distortion cancellation (reduction) action of power tube 30 is obtained by the above opposite-phase connection.

Plate p of power tube 30 is connected to the positive side of power source VB+ of the power tube through load 40, and cathode k of power tube 30 is connected to the negative side of power source VB+.

Driver transformer 20 in FIG. 1 also has a tertiary winding, i.e., magnetization control winding W3 for controlling a DC magnetized state of core MC of the magnetic circuit.

The hot side (black dot mark) of magnetization control winding W3 is connected to the positive side of DC magnetization control power source 50, and the cold side of winding W3 is connected to the negative side of source 50. Current i30 flows in winding W3 in a direction of an arrow indicated by a solid line. Therefore, DC magnetization of core MC by primary winding current i10 can be reduced or canceled by magnetization control winding current i30.

When DC magnetization (1) of core MC by primary winding current i10 (arrow indicated by the solid line) is stronger than DC magnetization (2) of core MC by secondary winding current i20 (arrow indicated by the solid line) (e.g., when the number of turns of winding W1 is equal to that of winding W2, and secondary current i20 of 20 mA flows at primary current i10 of 10 mA), magnetization control winding current i03 indicated by the arrow of the broken line may be flowed in magnetization control winding W3 to reduce or cancel DC magnetization of core MC (e.g., when the numbers of turns of windings W1, W2, and W3 are equal to each other, and secondary current i20 of 20 mA is obtained at primary current i10 of 10 mA, magnetization control winding current i03 of 10 mA is flowed).

The internal impedance of DC magnetization control power source 50 connected to magnetization control winding W3 serves as a load for drive signal source 10 through transformer 20. The magnitude of the secondary winding output voltage and its secondary distortion of transformer 20 change depending on the magnitude of this load (magnitude of the load impedance). Therefore, not only the magnitude and direction of magnetization control winding current i30 (or i03) flowing through magnetization control winding W3 but also the magnitude of the internal impedance of DC magnetization control power source 50 has a significant meaning.

To set a relatively low internal impedance of DC magnetization control power source 50 (e.g., several kΩ to several tens of kΩ), constant voltage source 50A with which variable resistor (several kΩ to several tens of kΩ) VR50A is connected in series can be used. Since the internal impedance of constant voltage source 50A is very low, the load impedance for magnetization control winding W3 is determined by the value of variable resistor VR50A. The magnitude of magnetization control winding current i30 (or i03) which is obtained upon determination of the value of variable resistor VR50A can be arbitrarily set by adjusting the output voltage of power source 50A.

To set the internal impedance of DC magnetization control power source 50 to a relatively large value (e.g., several tens of kΩ to several hundreds of kΩ), constant current source 50B connected in parallel with variable resistor (several tens of kΩ to several hundreds of kΩ) VR50B is used (to set winding W3 in an AC open state, parallel resistor VR50B is removed). Since the internal impedance of constant voltage source 50A is very high, the load impedance for magnetization control winding W3 is determined by the value of variable resistor VR50B. The magnitude of magnetization control winding current i30 upon determination of the value (load impedance for winding W3) of variable resistor VR50A can be arbitrarily set by adjusting the output current of current source 50B.

Figure 2:
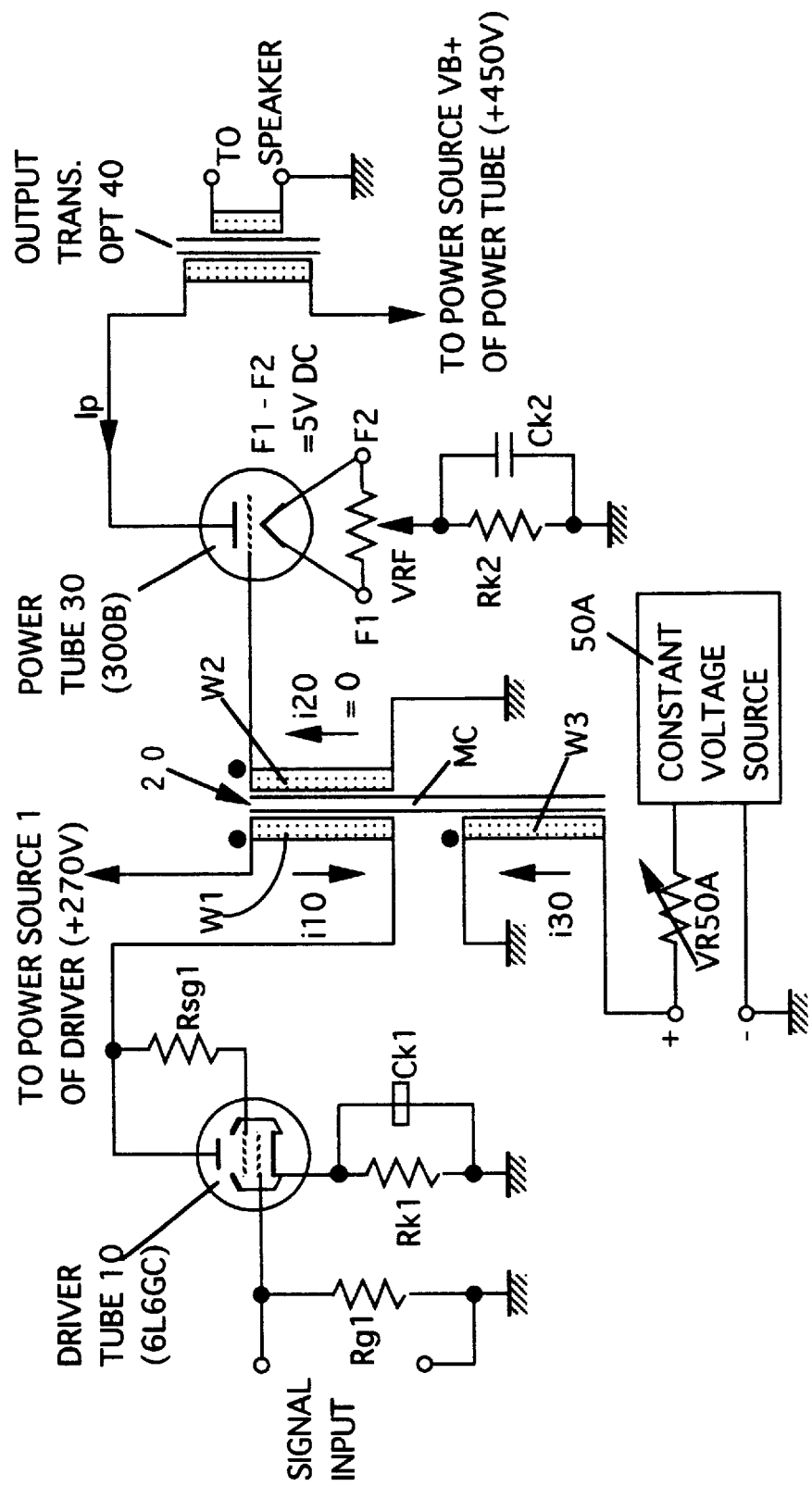
FIG. 2 is a circuit diagram for explaining a transformer-coupled amplifier (single amplifier) in which the output stage is constituted by a self-bias directly heated type triode vacuum tube (no grid current in the steady state) on the basis of the circuit shown in FIG. 1.

FIG. 2 shows a transformer-coupled amplifier (single amplifier) in which the output stage is constituted by a self-bias directly heated type triode vacuum tube (300B available from Western Electric, U.S.A. or its equivalent) on the basis-of the circuit in FIG. 1. In this case, a 5L6GC beam tube having triode connection is used as drive signal source or driver tube 10, and a speaker (not shown) connected through single output transformer OPT 40 is used as load 40.

More specifically, the first grid of driver tube 10 is grounded through grid resistor Rg1, and an external signal input is applied across this grid resistor Rg1. The cathode of driver tube 10 is grounded through cathode resistor Rk1. Cathode bypass capacitor Ck1 is connected in parallel with this resistor Rk1, and the cathode of driver tube 10 is AC-grounded. The screen grid of driver tube 10 is connected to the plate of driver tube 10 through screen resistor Rsg1. The plate of driver tube 10 is connected to power source 1 of the driver (e.g., +270 V) through primary winding W1 of driver transformer 20 (the cold side of winding W1 is connected to the plate of driver tube 10). The operation bias of driver tube 10 is given by a voltage drop of the sum (primary current i10 of transformer 20) of the plate current flowing through cathode resistor Rk1 and the screen grid current.

The hot side of secondary winding W2 of driver transformer 20 is connected to the control grid of power tube (300B) 30, and the cold side of secondary winding W2 is grounded. Power source VB+ (e.g., +450 V) of the power tube is applied to the plate of power tube 30 through the primary winding of output transformer OPT 40. A speaker having an impedance of about 4 Ω to 16 Ω is connected to the secondary winding of output transformer OPT 40. Hum balancer VRF is connected across the filament of power tube 30. The slidable terminal of hum balancer VRF is grounded through self-bias resistor Rk2. Bypass capacitor Ck2 is connected in parallel with this resistor Rk2, and the filament of power tube 30 is AC-grounded.

The filament of power tube 30 is DC-ignited at 5 Vdc or AC-ignited at 5 Vac. In AC ignition, filament hum noise tends to be generated in the secondary output of output transformer OPT 40. Hum balancer VRF is finely adjusted to be set to the minimum point of hum noise. In DC ignition, hum noise is small even if hum balancer VRF is not finely adjusted. If a ripple is included in filament DC ignition voltage of 5 Vcd, hum balancer VRF is finely adjusted to minimize residual noise caused by this ripple.

DC ignition of power tube 30 is not limited to 5-Vdc constant voltage ignition. If the rated filament current of power tube 30 is 1.2 A, the filament may be ignited with the constant current of 1.2 Adc. In constant current ignition, when a current shunted into filament resistor VRF is, e.g., 100 mA, the constant current output must be 1.3 A, which is the sum of the filament current and the shunt component.

The hot side of tertiary winding (magnetization control winding) W3 of driver transformer 20 is grounded, and the cold side of transformer 20 is connected to the positive terminal of constant voltage source 50A through variable resistor VR50A. The negative terminal of power source 50A is grounded.

In the above arrangement, since grid current i20 of power tube 30 is regarded as zero in the steady state, DC magnetization of core MC of the magnetic circuit of driver transformer 20 cannot be canceled by current i20. DC magnetization of core MC of the magnetic circuit of transformer 20 magnetized by driver tube plate current i10 can be canceled by flowing appropriate current i30 to tertiary winding (magnetization control winding) W3.

When the ratio of the numbers of turns of windings W1, W2, and W3 of transformer 20 is given by 1:3:1, and driver tube plate current i10 is given as 14 mA, magnetization control current i30 of 14 mA is flowed to winding W3 in a direction indicated by an arrow in FIG. 2 to allow cancellation of DC magnetization of core MC of transformer 20. In this case, if current i30 is limited to 10 mA, 4-mA DC magnetization of driver tube current (14 mA) i10 can be intentionally left. On the other hand, if current i30 is set at 20 mA, a magnetized state (6 mA in winding W3) opposite to DC magnetization caused by driver tube current (14 mA) i10 can be intentionally set.

The load impedance connected to winding W3 can be determined by resistor VR50A. Assume that the resistance of resistor VR50A is set to 4.7 kΩ, that the DC resistance of winding W3 is set to 220 Ω, and that magnetization control current i30 of 10 mA is flowed to winding W3. In this case, a voltage of +49.2 V is output from constant voltage source 50A. When magnetization control current i30 of 20 mA is flowed to winding W3, a voltage output of +98.4 V is required for constant voltage source 50A.

That is, after the predetermined magnitude of an AC load for driver tube 10 is given by resistor VR50A, the output voltage of power source 50A is so determined as to flow predetermined magnetization control current (magnetization cancellation current for the transformer core) i30 to winding W3 through resistor VR50A.

Alternatively, when the output voltage of constant voltage source 50A is fixed to, e.g., +50 V, and the resistance of variable resistor VR50A is adjusted between 2,280 Ω and 9,780 Ω (in this case, when the DC resistance of 220 Ω of winding W3 is added to the resistance of variable resistor VR50A, the resistance changes between 2.5 kΩ and 10 kΩ), magnetization control current can be arbitrarily adjusted between 20 mA and 5 mA.

When this adjustment method is employed, both the magnitude of magnetization control current i30 and the magnitude of the load impedance for driver tube 10 change. A change in auditory sound quality of the entire amplifier in FIG. 2 occurs due to a change in state of DC magnetization cancellation of transformer core MC and a change in load impedance for driver tube 10. To avoid the sound quality change caused by the change in load impedance for driver tube 10, the resistance of resistor VR50A is fixed, and only the output voltage of constant voltage source 50A is changed.

The resistance of resistor VR50A and the magnitude of current i30 are appropriately changed in accordance with the measurement result of electrical characteristics (e.g., distortion and frequency characteristics) and the listening result after the power amplifier in FIG. 2 is finished.

Assume that driver tube current i10 of 25 mA flows in primary winding W1 when the primary DC current of transformer 20 is allowed up to 25 mA (transformer core MC has a level lower than the magnetic saturation level up to 25 mA). In this case, magnetization control current i30 of 25 mA need not necessarily be flowed to cancel DC magnetization of transformer core MC. The optimal points of distortion and frequency characteristics do not always coincide with the auditory optimal point. A sufficient sound quality improvement effect may be obtained even at magnetization control current i30 of 3 mA to 3.5 mA.

The single amplifier circuit in FIG. 2 is not limited to a power tube having a relatively deep bias, like a 300B tube even if the tube is a similar negative bias directly heated type triode vacuum tube. The circuit in FIG. 2 can be applied even if the power tube is constituted by a large tube (e.g., DA30 or 845) having a deep bias in an actual operation, provided that the resistance of bias resistor Rk2 is appropriately selected. In addition, the circuit in FIG. 2 can also be applied to a power tube (e.g., PX25 or 211) having a shallower bias.

Figure 3:
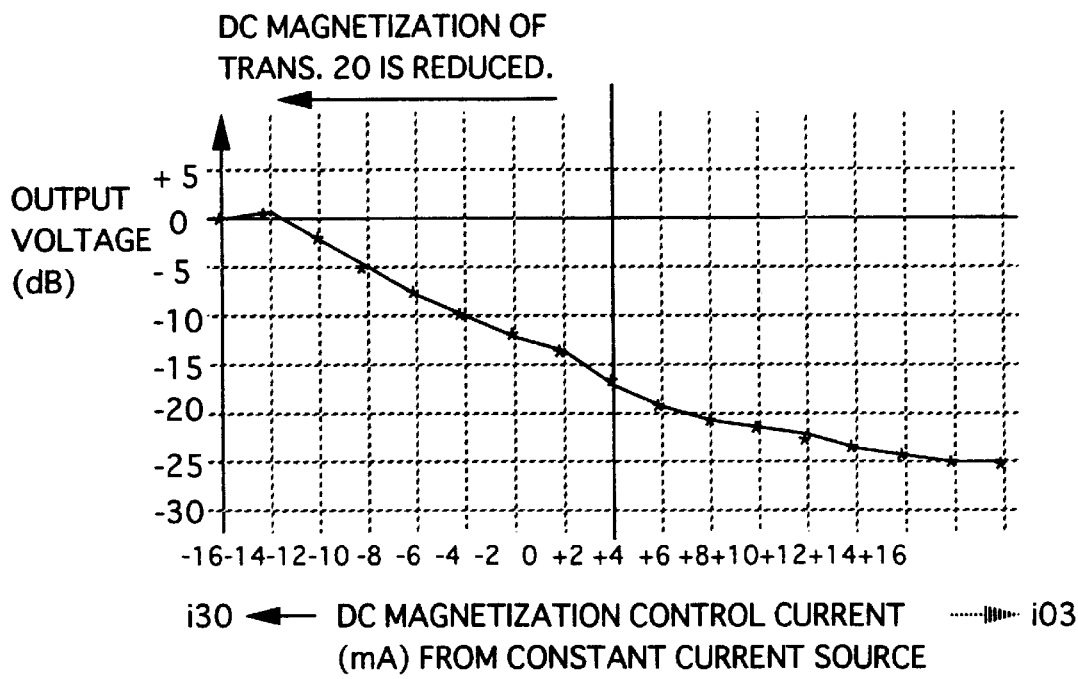
FIG. 3 is a graph showing the relationship between the output voltage of the amplifier as a function of the winding W3 excitation current (DC magnetization control current) in the transformer-coupled amplifier in FIG. 2 when magnetization control winding W3 of transformer 20 is excited by constant current source 50B in FIG. 1.
Figure 4:
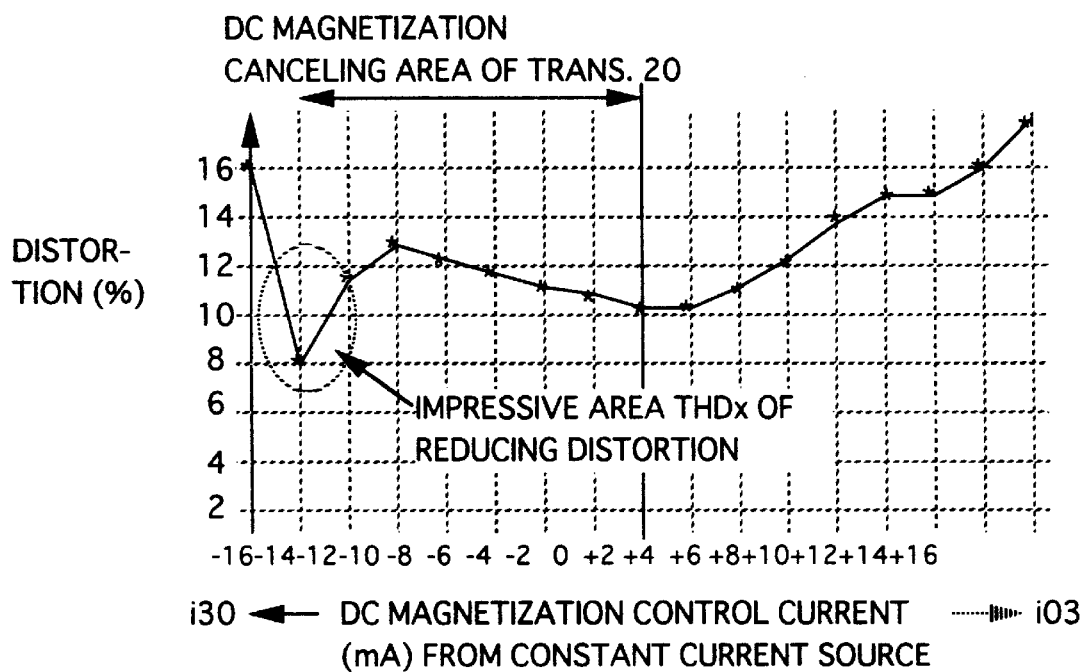
FIG. 4 is a graph showing the relationship between the distortion of the amplifier as a function of the winding W3 excitation current (DC magnetization control current) in the transformer-coupled amplifier in FIG. 2 when magnetization control winding W3 of transformer 20 is excited by constant voltage source 50B in FIG. 1.

FIG. 3 is a graph for explaining the output voltage (i.e., the output voltage at the speaker terminal) of the amplifier as a function of winding W3 excitation current (DC magnetization control current) i30 (or i03 in FIG. 1) in the transformer-coupled amplifier in FIG. 2 when magnetization control winding W3 of transformer 20 is excited with constant current source 50B in FIG. 1 (the current value with a negative sign along the abscissa in each of FIGS. 3 and 4 represents current i30 indicated by the arrow of the solid line in FIG. 1, and the current value with a positive sign along the abscissa represents current i03 indicated by the arrow of the broken line in FIG. 1).

As shown in FIG. 3, when DC magnetization of the transformer core is reduced with current i30 from constant current source 50B having a high internal impedance, the output increases with an increase in current i30 up to i30=−14 mA at which the DC magnetized state is almost canceled. The output gradually decreases with an increase in current i03 in a direction to increase DC magnetization of the transformer core. The change in output stops at a saturation current (i03 of about 10 mA or more) of core MC.

FIG. 4 is a graph for explaining the distortion of the amplifier as a function of the winding W3 excitation current (DC magnetization control current) in the transformer-coupled amplifier in FIG. 2 when magnetization control winding W3 of transformer 20 is excited with constant current source 50B in FIG. 1. The abscissa in FIG. 4 corresponds to that in FIG. 3.

In comparison between FIGS. 3 and 4, the output becomes maximum and the distortion becomes minimum (DC magnetization control power source 50 is of a constant current type) at current i30=−14 mA obtained when DC magnetization of core MC of transformer 20 is almost canceled.

More specifically, when DC magnetization control power source 50 is constituted by constant current source 50B (the internal impedance of the power source is relatively high), area (impressive area of reducing distortion) THDx in which distortion reduction is particularly impressive in the amplifier as a whole is obtained (note that the distortion reduction effect may not be typically observed as compared with the case in FIG. 4, depending on the characteristics of drive signal source 10; this distortion reduction effect is not observed by means of only driver transformer 20, but is also associated with the internal impedance and nonlinearity of drive signal source 10).

The values and the shapes of curves in the graphs of FIGS. 3 and 4 change depending on the detailed constituent components and an operating point of an amplifier to be tested. Qualitatively, the optimal distortion and output level points (i.e., impressive area THDx of reducing distortion) are present near the DC magnetization cancellation point of the core of transformer 20. To intentionally generate a certain degree of distortion, current i30 having the magnitude offset from the DC magnetization cancellation point of the core of transformer 20 may be employed.

Figure 5:
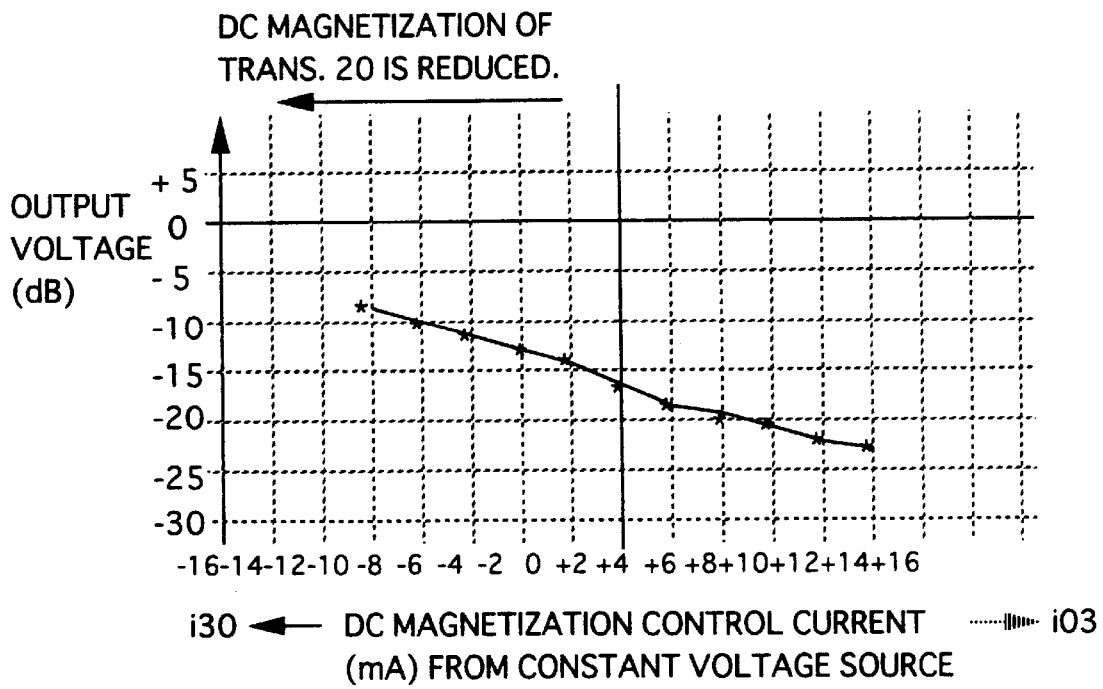
FIG. 5 is a graph showing the relationship between the output voltage of the amplifier as a function of the winding W3 excitation current (DC magnetization control current) in the transformer-coupled amplifier in FIG. 2 when magnetization control winding W3 of transformer 20 is excited by constant voltage source 50A in FIG. 1.

FIG. 5 is a graph for explaining the output voltage of the amplifier as a function of the winding W3 excitation current (DC magnetization control current) in the transformer-coupled amplifier in FIG. 2 when magnetization control winding W3 of transformer 20 is excited with constant voltage source 50A in FIG. 1.

As shown in FIG. 5, when DC magnetization of the transformer core is reduced with current i30 from constant voltage source 50A having a relatively low internal impedance, the output increases with an increase in current i30 up to i30=−10 mA at which the DC magnetized state is reduced. When current i03 in a direction to increase DC magnetization of the transformer core increases, the output gradually decreases.

In FIG. 5, the maximum value of DC magnetization control current (i30 or i03) is set to 10 mA in association with the maximum output voltage of constant voltage source 50A used in the test (when the resistance of resistor VR50A, the DC resistance of winding W3, and the continuous variable output voltage of constant voltage source 50A are set to 4.7 kΩ, 220 Ω, and 0 V to 50 V, respectively, the maximum value of test current i30 or i03 which can be supplied to winding W3 is about 10 mA). When the maximum output voltage of constant voltage source 50A, however, has a sufficient margin, the DC magnetization control current (i30 or i03) of 10 mA or more can be flowed.

Figure 6:
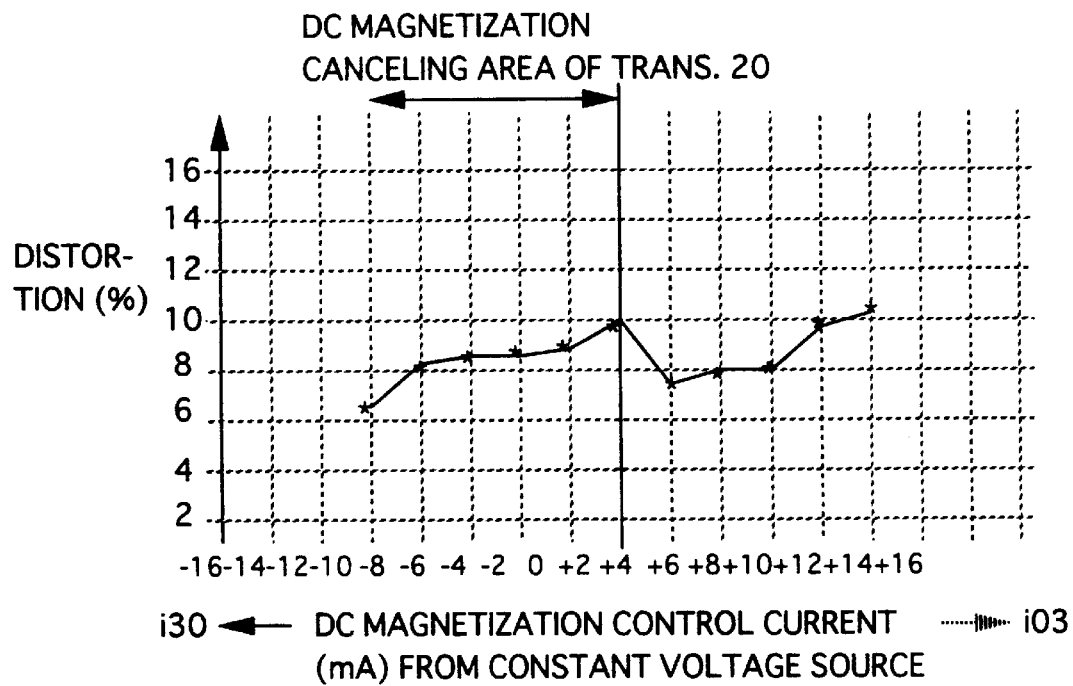
FIG. 6 is a graph showing the relationship between the distortion of the amplifier as a function of the winding W3 excitation current (DC magnetization control current) in the transformer-coupled amplifier in FIG. 2 when magnetization control winding W3 of transformer 20 is excited by constant current source 50A in FIG. 1.

FIG. 6 is a graph for explaining the output distortion of the amplifier as a function of the winding W3 excitation current (DC magnetization control current) in the transformer-coupled amplifier in FIG. 2 when magnetization control winding W3 of transformer 20 is excited with constant voltage source 50A in FIG. 1. The abscissa in FIG. 6 corresponds to that of FIG. 5.

When the winding W3 excitation current is extracted from constant voltage source 50A having a relatively low internal impedance, impressive area THDx of reducing distortion in FIG. 4 cannot be observed within the test current range (−10 mA to +10 mA). When the test current is increased to about −15 mA, it is possible to observe an impressive area of reducing distortion like area THDx in FIG. 4.

In comparison between FIGS. 4 and 6, when the amplifier in FIG. 2 is used as a test amplifier, the distortion in use of constant voltage source 50B is slightly lower than that in use of constant current source 50A. In embodiments from FIG. 8, constant voltage source 50B is used to cancel DC magnetization of core MC of transformer 20. This does not indicate that constant current source 50A is of no use. A better auditory result may be obtained not in use of constant voltage source 50B but in use of constant current source 50A depending on a change in circuit operation point with the circuit arrangement and constituent parts being kept unchanged, or depending on a combined speaker system in some embodiments.

Figure 7:
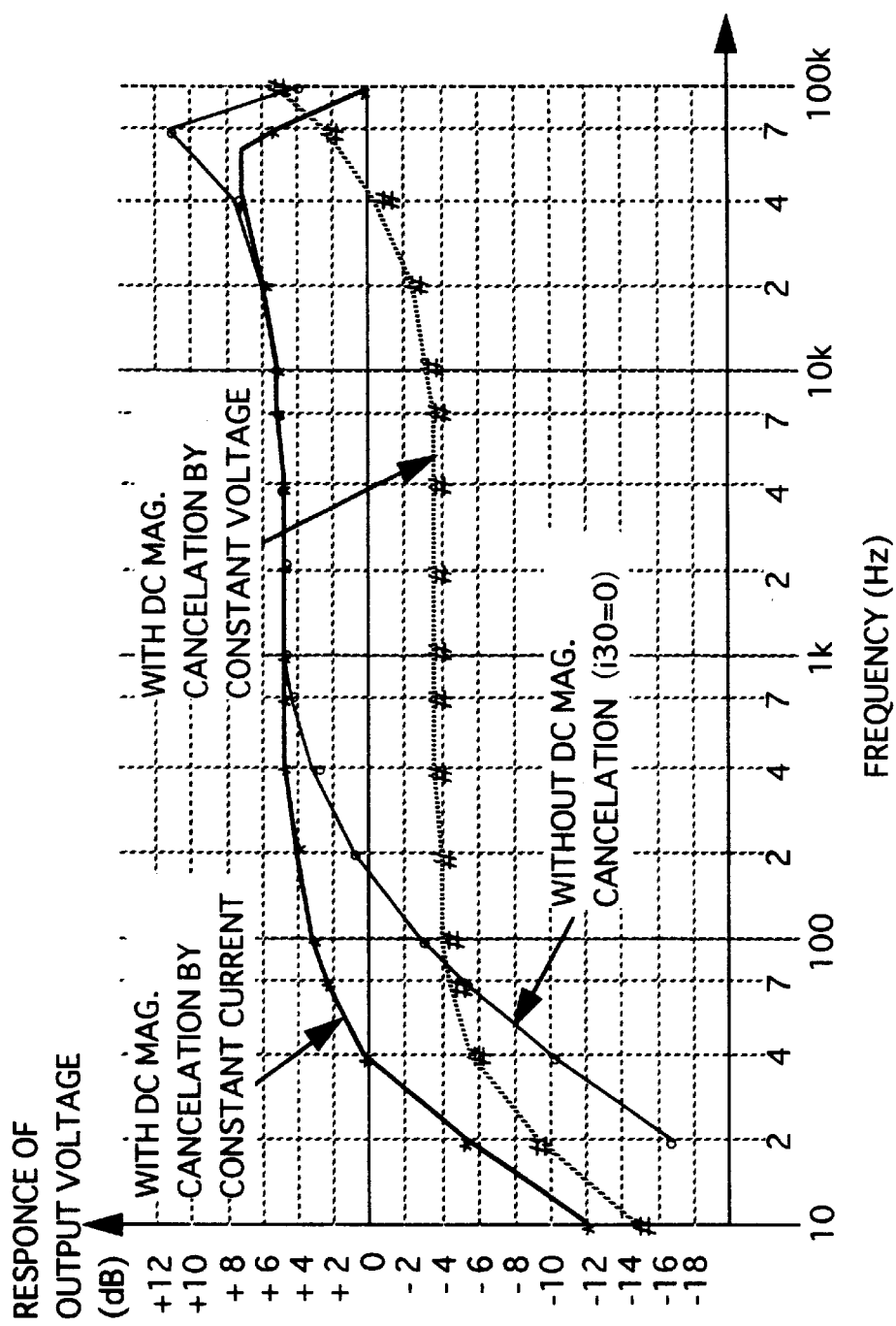
FIG. 7 is a graph showing an output voltage frequency response (thick solid line) with cancellation of DC magnetization of transformer 20 by constant voltage source 50A, an output voltage frequency response (thick broken line) with cancellation of DC magnetization of transformer 20 by constant current source 50B, and an output voltage frequency response (thin solid line) without cancellation of DC magnetization of transformer 20 in the transformer-coupled amplifier in FIG. 2.

FIG. 7 is a graph showing an output voltage frequency response (thick solid line) with cancellation of DC magnetization of transformer 20 by constant voltage source 50A, an output voltage frequency response (thick broken line) with cancellation of DC magnetization of transformer 20 by constant current source 50B, and an output voltage frequency response (thin solid line) without cancellation of DC magnetization of transformer 20 in the transformer-coupled amplifier in FIG. 2. This frequency response represents the induction voltage of secondary winding W2 of transformer 20 with respect to the grid signal input of driver tube 10. Transformer 20 has the ratio of the numbers of turns of windings W1, W2, and W3 as 1:3:1.

When DC magnetization of core MC of the magnetic circuit of transformer 20 is left unchanged (i30=0), the inductance of primary winding W1 of transformer 20 greatly decreases because the effective permeability of core MC is greatly decreased due to magnetic saturation. The low-frequency response is greatly degraded (if the voltage response at 1 kHz is defined as 0 dB, the response decreases −15 dB at 40 Hz).

When DC magnetization of core MC of the magnetic circuit of transformer 20 is canceled by constant current source 50A in FIG. 1 (i30=i10), the effective permeability of core MC increases due to the absence of magnetic saturation of core MC, and the inductance of primary winding W1 of transformer 20 is sufficiently assured. The low-frequency response can be typically improved (if the voltage response at 1 kHz is defined as 0 dB, the response deceases about −5 dB at 40 Hz, which is improved by 10 dB as compared with the response without magnetic saturation cancellation).

When DC magnetization of magnetic circuit core MC of transformer 20 is canceled by constant voltage source 50B in FIG. 1 (i30=i10), the effective permeability of core MC increases due to the absence of magnetic saturation of core MC, and the inductance of primary winding W1 of transformer 20 is sufficiently assured. Winding W3 is dumped by the relatively low internal impedance (e.g., VR50A=1 kΩ) of constant voltage source 50B, the relative low-frequency response can be typically improved although the intermediate-frequency (100 Hz to 10 kHz) level is lowered.

This low-frequency response improvement effect will be described in detail. A voltage response at 1 kHz is defined as 0 dB, the response becomes about −2 dB at 40 Hz. The response is improved by 13 dB as compared with the response without magnetic saturation cancellation. In comparison with a lower frequency of 20 Hz, the response without magnetic saturation cancellation is lowered −22 dB at 1 kHz. When magnetic saturation is canceled at the internal impedance of 1 kΩ of constant voltage source 50B, the response is lowered only −5 dB at 1 kHz.

An increase in high frequencies (10 kHz or more indicated by the broken line in FIG. 7) upon cancellation of DC magnetization of core MC of transformer 20 using constant voltage source 50A can be suppressed when a terminating resistor (not shown) having several tens of kΩ to several hundreds of kΩ is inserted in parallel with secondary winding W2 of transformer 20.

Figure 8:
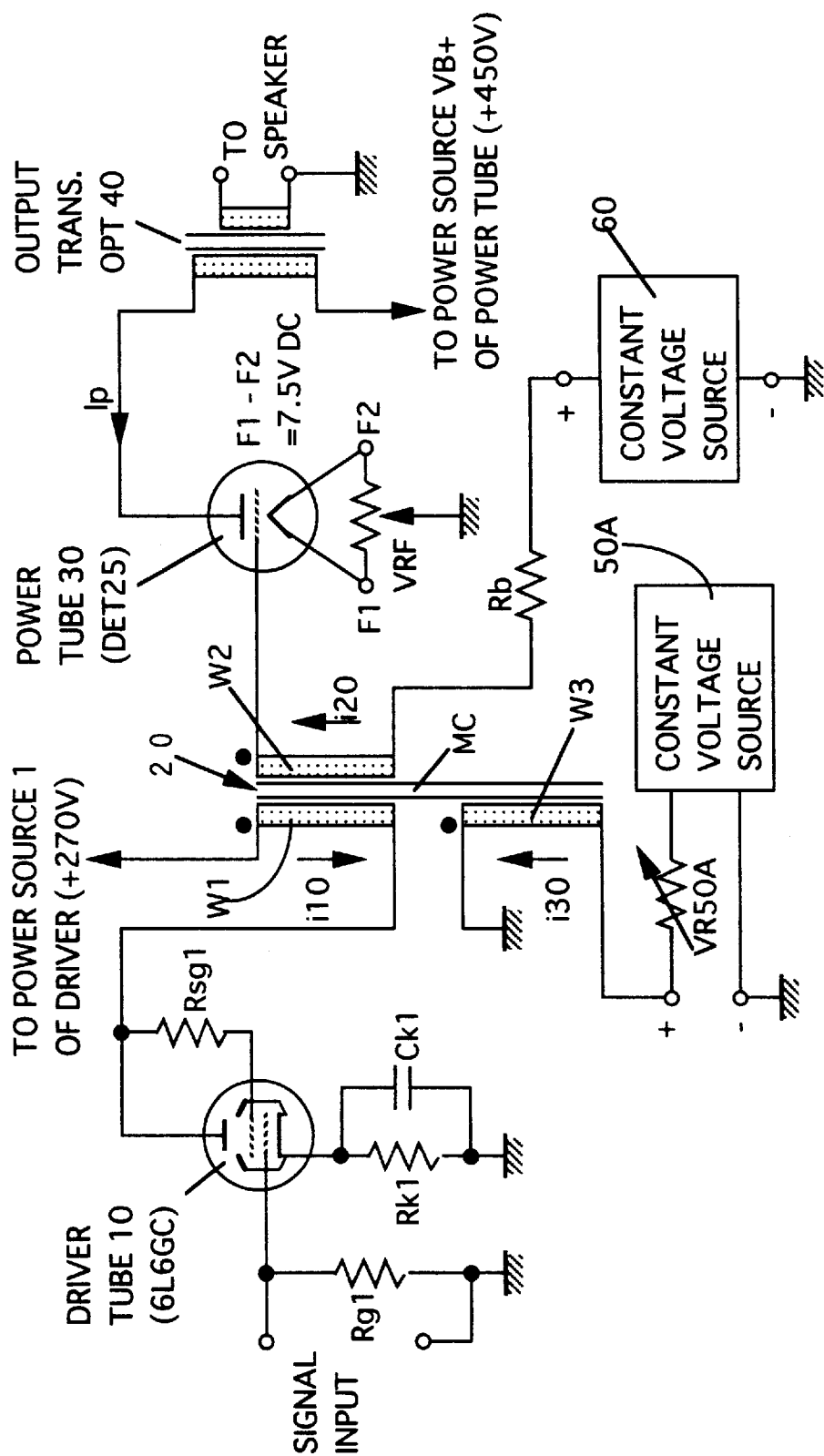
FIG. 8 is a circuit diagram for explaining a transformer-coupled amplifier (single amplifier) in which the output stage is constituted by a fixed positive bias directly heated type triode vacuum tube (a grid current flows to cancel DC magnetization of transformer 20 in the steady state) on the basis of the circuit shown in FIG. 1.

FIG. 8 shows a transformer-coupled amplifier (single amplifier) in which the output stage is constituted by a fixed positive bias directly heated type triode vacuum tube (a grid current flows in a direction to cancel DC magnetization of transformer 20 in the steady state) on the basis of the circuit in FIG. 1.

In the single amplifier of FIG. 2, since the power tube (300B) is a negative bias tube having a deep bias, transformer 20 having the large number of turns of winding W2 (the ratio of the numbers of turns of windings W1, W2, and W3 is 1:3:1) is employed.

To the contrary, in a single amplifier of FIG. 8, since the power tube (DET25) is a positive bias tube having a relatively shallow bias, transformer 20 having the small number of turns of winding W2 (the ratio of the numbers of turns of windings W1, W2, and W3 is 1:0.5 to 1.5:1, e.g., 1:1:1).

Referring to FIG. 8, the first grid of driver tube 10 is grounded through grid resistor Rg1, and an external signal input is applied across this grid resistor Rg1. The cathode of driver tube 10 is grounded through cathode resistor Rk1. Cathode bypass capacitor Ck1 is connected in parallel with this resistor Rk1. The cathode of driver tube 10 is AC-grounded. The screen grid of driver tube 10 is connected to the plate of driver tube 10 through screen resistor Rsg1. The plate of driver tube 10 is connected to power supply 1 (e.g., +270 V) of the driver through primary winding W1 of driver transformer 20 (the cold side of winding W1 is connected to the plate of driver tube 10). The operation bias of driver tube 10 is given by a voltage drop of the sum (primary current i10 of transformer 20) of the plate current flowing through cathode resistor Rk1 and the screen grid current.

Power tube (DET25) 30 in FIG. 8 requires power driving unlike in the negative bias tube (e.g., 300B). Plate current i10 of driver tube 10 is slightly larger than that in FIG. 2 (e.g., i10=15 mA).

The hot side of secondary winding W2 of driver transformer 20 is connected to the control grid of power tube (DET25) 30. The cold side of this secondary winding W2 is connected to the positive terminal of constant voltage source 60 through resistor Rb (about 3 kΩ). The negative terminal of constant voltage source 60 is grounded. The output voltage of power supply 60 is set such that the grid current (secondary winding current i20 of transformer 20) of power tube (DET25) 30 is 10 mA (on the order of several tens of V).

Power source VB+ (e.g., +450 V) of the power tube is applied to the plate of power tube 30 through the primary winding of output transformer OPT 40. A speaker having an impedance of about 4 Ω to 16 Ω is connected to the secondary winding of output transformer OPT 40. Hum balancer VRF is connected across the filament of power tube 30, and the slidable terminal of hum balancer VRF is grounded.

The filament of power tube 30 is DC-ignited at 7.5 Vdc or AC-ignited at 7.5 Vac. In AC ignition, filament hum noise tends to be generated in the secondary output of output transformer OPT 40. Hum balancer VRF is finely adjusted to be set to the minimum point of hum noise. In DC ignition, hum noise is small even if hum balancer VRF is not finely adjusted. If a ripple is included in filament DC ignition voltage of 7.5 Vcd, hum balancer VRF is finely adjusted to minimize residual noise caused by this ripple.

DC ignition of power tube 30 is not limited to 7.5-Vdc constant voltage ignition. The filament of power tube 30 may be ignited with the rated constant current.

The hot side of tertiary winding (magnetization control winding) W3 of driver transformer 20 is grounded, and the cold side of transformer 20 is connected to the positive terminal of constant voltage source 50A through variable resistor VR50A. The negative terminal of power source 50A is grounded.

In the above arrangement, since plate current i10 of driver tube 10 and grid current i20 of power tube 30 in the steady state are assumed to be 15 mA and 10 mA, respectively, DC magnetization of core MC of the magnetic circuit of driver transformer 20 cannot be completely canceled. DC magnetization of core MC of the magnetic circuit of transformer 20 magnetized by driver tube plate current i10 and power tube grid current i20 can be canceled by flowing appropriate current i30 to tertiary winding (magnetization control winding) W3.

When the ratio of the numbers of turns of windings W1, W2, and W3 of transformer 20 is given by 1:1:1, driver tube plate current i10 is given as 15 mA, and power tube grid current i20 is given as 10 mA, magnetization control current i30 of 5 mA is flowed to winding W3 in a direction indicated by an arrow in FIG. 2 to allow cancellation of DC magnetization of core MC of transformer 20. In this case, if current i30 is limited to 2 mA, 3-mA DC magnetization of the difference (5 mA) between driver tube current (15 mA) i10 and power tube grid current (10 mA) i20 can be intentionally left. On the other hand, if current i30 is set at 10 mA, a magnetized state (5 mA as a whole) opposite to DC magnetization caused by driver tube current (15 mA) i10 can be intentionally set.

In the arrangement of FIG. 8, since the grid current flows in power tube (DET25) 30, its input impedance is relatively low. Resistor Rb in FIG. 8 can be used to slightly change (increase) this input impedance and also has a function of suppressing an excessive grid current flow.

The load impedance connected to winding W3 can be determined by resistor VR50A. That is, after the predetermined magnitude of an AC load for driver tube 10 is given by resistor VR50A, the output voltage of power source 50A is so determined as to flow predetermined magnetization control current (magnetization cancellation current for the transformer core) i30 to winding W3 through resistor VR50A.

Alternatively, when the output voltage of constant voltage source 50A is fixed to, e.g., +50 V, and the resistance of variable resistor VR50A is adjusted between 2,280 Ω and 9,780 Ω (in this case, when the DC resistance of 220 Ω of winding W3 is added to the resistance of variable resistor VR50A, the resistance changes between 2.5 kΩ and 10 kΩ), magnetization control current can be arbitrarily adjusted between 20 mA and 5 mA.

When this adjustment method is employed, both the magnitude of magnetization control current i30 and the magnitude of the load impedance for driver tube 10 change.

A change in auditory sound quality of the entire amplifier in FIG. 8 occurs due to a change in state of DC magnetization cancellation of transformer core MC and a change in load impedance for driver tube 10. To avoid the sound quality change caused by the change in load impedance for driver tube 10, the resistance of resistor VR50A is fixed, and only the output voltage of constant voltage source 50A is changed.

Note that since the grid input impedance of power tube (DET25) 30 including resistor Rb serves as a load for driver tube 10, a sound quality change tendency upon a change in resistance of resistor VR50A is not necessarily identical to that in FIG. 2.

In any case, the resistance of resistor Rb, the output voltage value of constant voltage source 60, the resistance of resistor VR50A, and the magnitude of current i30 are appropriately changed in accordance with the measurement result of electrical characteristics (e.g., distortion and frequency characteristics) and the listening result after the power amplifier in FIG. 8 is finished.

The power tube of the single amplifier circuit (input transformer-inversion-coupled single amplifier circuit) in FIG. 8 is not limited to a DET25. A high-$\mu$, high-internal-impedance transmission tube (e.g., RCA830) can be used if the voltage of power source VB+ of the power tube and the output voltage of positive bias power source 60 are appropriately selected.

Figure 9:
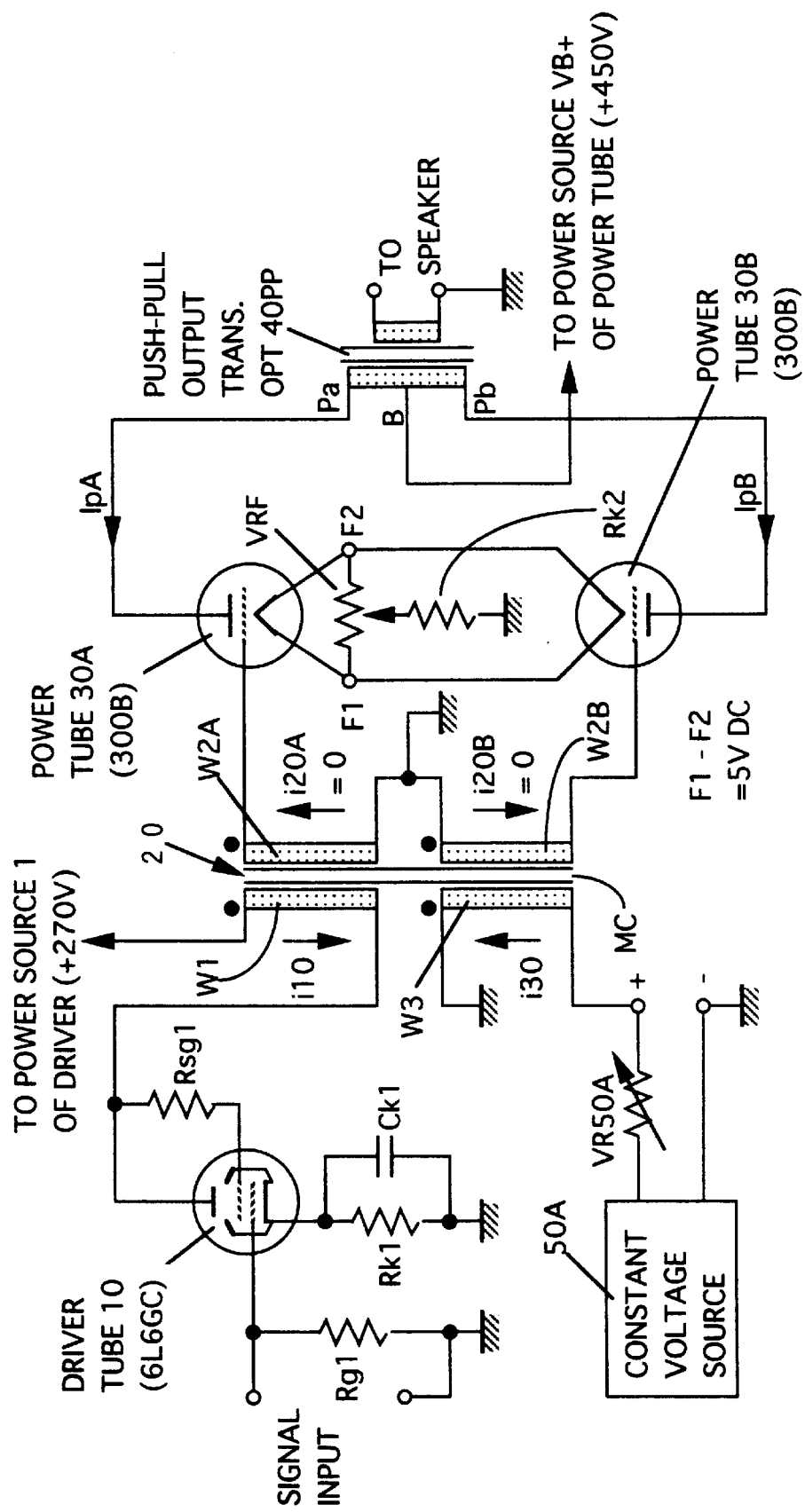
FIG. 9 is a circuit diagram for explaining a transformer-coupled amplifier (push-pull amplifier) in which the output stage is constituted by a pair of self-bias directly heated type triode vacuum tubes (no grid current in the steady state) on the basis of the circuit shown in FIG. 1.

FIG. 9 shows a transformer-coupled amplifier (push-pull amplifier) in which the output stage is constituted by a self-bias directly heated type triode vacuum tube (300B available from Western Electric, U.S.A. or its equivalent) on the basis of the circuit in FIG. 1. In this case, a 6L6GC beam tube having triode connection is used as drive signal source or driver tube 10, and a speaker (not shown) connected through push-pull output transformer OPT 40PP is used as load 40.

More specifically, the first grid of driver tube 10 is grounded through grid resistor Rg1, and an external signal input is applied across this grid resistor Rg1. The cathode of driver tube 10 is grounded through cathode resistor Rk1. Cathode bypass capacitor Ck1 is connected in parallel with this resistor Rk1, and the cathode of driver tube 10 is AC-grounded. The screen grid of driver tube 10 is connected to the plate of driver tube 10 through screen resistor Rsg1. The plate of driver tube 10 is connected to power source 1 of the driver (e.g., +270 V) through primary winding W1 of driver transformer 20.

The hot side of first secondary winding W2A of driver transformer 20 is connected to the control grid of first power tube 30A, and the cold side of first secondary winding W2A is grounded. The hot side of second secondary winding W2B of driver transformer 20 is connected to the control grid of second power tube 30B, and the cold side of second secondary winding W2B is grounded. By these winding connections, the grid signal of first power tube 30A can be set to have an opposite phase to that of the grid signal of second power tube 30B. That is, push-pull drive signals of the power tubes can be phase-inverted.

The plate of first power tube 30A is connected to primary winding terminal Pa of output transformer OPT 40PP, and the plate of second power tube 30B is connected to primary winding terminal Pb of output transformer OPT 40PP. Middle terminal B of output transformer OPT 40PP is connected to power source VB+ (+450 V) of the power tube.

A speaker having an impedance of about 4 Ω to 16 Ω is connected to the secondary winding of output transformer OPT 40PP. Hum balancer VRF is connected across the filaments of the pair of push-pull power tubes 30A and 30B. The slidable terminal of hum balancer VRF is grounded through self-bias resistor Rk2. Bypass capacitor Ck2 is connected in parallel with this resistor Rk2. The filaments of power tubes 30A and 30B are AC-grounded.

The filaments of power tubes 30A and 30B can be DC-ignited at 5 Vdc or AC-ignited at 5 Vac. In the push-pull amplifier, since the hum component of the filament of power tube 30A can be canceled by the hum component of the filament of power tube 30B, a hum-free state can be obtained by finely adjusting hum balancer VRF even in AC ignition.

Even in the push-pull amplifier, residual noise can be reduced in DC ignition of the filament. In this case, DC ignition of power tubes 30A and 30B is not limited to constant voltage ignition. The filaments of two power tubes 30 connected in parallel with each other may be ignited with a constant current twice the rated current (the ratings of each filament are 5 V and 1.2 A; if the resistance of hum balancer VRF is 50 Ω, and a current of 100 mA flows through hum balancer VRF, the current output of the constant current source for igniting the filament becomes 2.5 A).

In perfect DC constant current ignition, a filament hum is rarely generated, and therefore hum balancer VRF can be omitted. When hum balancer VRF is omitted, one of filament terminals F1 and F2 is directly connected to self-bias resistor Rk2.

The hot side of tertiary winding (magnetization control winding) W3 of driver transformer 20 is grounded, and the cold side of tertiary winding W3 is connected to the positive terminal of constant voltage source 50A through variable resistor VR50A. The negative terminal of power source 50A is grounded.

In the above arrangement, since grid currents i20A and i20B of power tubes 30A and 30B can be regarded as zero in the steady state, DC magnetization of core MC of the magnetic circuit of driver transformer 20 cannot be canceled by currents i20A and i20B. DC magnetization of core MC of the magnetic circuit of transformer 20 which is caused by driver tube plate current i10 can be canceled by flowing appropriate current i30 to tertiary winding (magnetization control winding) W3.

For example, the ratio of the numbers of turns of windings W1, W2A+W2B, and W3 of transformer 20 is given as 1:1.5+1.5:1. When plate current i10 of the driver tube is set to 10 mA, magnetization control current i30 of 10 mA is flowed in winding W3 in the direction of the arrow in FIG. 2 to cancel DC magnetization of core MC of transformer 20. When current i30 is suppressed to 7 mA, 3-mA DC magnetization of driver tube current (10 mA) i10 can be intentionally left. When current i30 of 12 mA is flowed, a magnetized state (2 mA in winding W3) having a direction opposite to DC magnetization generated by current (10 mA) i10 of the driver tube can be intentionally set.

The load impedance connected to winding W3 can be determined by resistor VR50A. Assume that the resistance of resistor VR50A is set to 4.7 kΩ, that the DC resistance of winding W3 is set to 220 Ω, and that magnetization control current i30 of 10 mA is flowed to winding W3. In this case, a voltage of +49.2 V is output from constant voltage source 50A. That is, after the predetermined magnitude of an AC load for driver tube 10 is given by resistor VR50A, the output voltage of power source 50A is so determined as to flow predetermined magnetization control current (magnetization cancellation current for the transformer core) i30 to winding W3 through resistor VR50A.

Alternatively, when the output voltage of constant voltage source 50A is fixed to, e.g., +50 V, and the resistance of variable resistor VR50A is adjusted between 2,280 Ω and 9,780 Ω (in this case, when the DC resistance of 220 Ω of winding W3 is added to the resistance of variable resistor VR50A, the resistance changes between 2.5 kΩ and 10 kΩ), magnetization control current can be arbitrarily adjusted between 20 mA and 5 mA. When this adjustment method is employed, both the magnitude of magnetization control current i30 and the magnitude of the load impedance for driver tube 10 change. A change in auditory sound quality of the entire amplifier in FIG. 9 occurs due teal a change in state of DC magnetization cancellation of transformer core MC and a change in load impedance for driver tube 10.

The resistance of resistor VR50A and the magnitude of current i30 are appropriately changed in accordance with the measurement result of electrical characteristics (e.g., distortion and frequency characteristics) and the listening result after the power amplifier in FIG. 9 is finished.

Assume that driver tube current i10 of 5 mA flows in primary winding W1 when the rated primary current of transformer 20 is set to 15 mA. In this case, magnetization control current i30 of 5 mA need not necessarily be flowed to cancel DC magnetization of transformer core MC. The optimal points of distortion and frequency characteristics do not always coincide with the auditory optimal point. A sufficient sound quality improvement effect may be obtained even at magnetization control current i30 of more than 5 mA (this is not always true).

The push-pull amplifier circuit in FIG. 9 is not limited to a power tube having a relatively deep bias, like a 300B tube even if the tube is a similar negative bias directly heated type triode vacuum tube. The circuit in FIG. 9 can be applied even if the power tube is constituted by a large tube (e.g., DA30, DA60, or 845) having a deep bias in an actual operation, provided that the resistance of bias resistor Rk2 is appropriately selected. In addition, the circuit in FIG. 9 can also be applied to a power tube (e.g., PX25, BF25, or 211) having a shallower bias.

Figure 10:
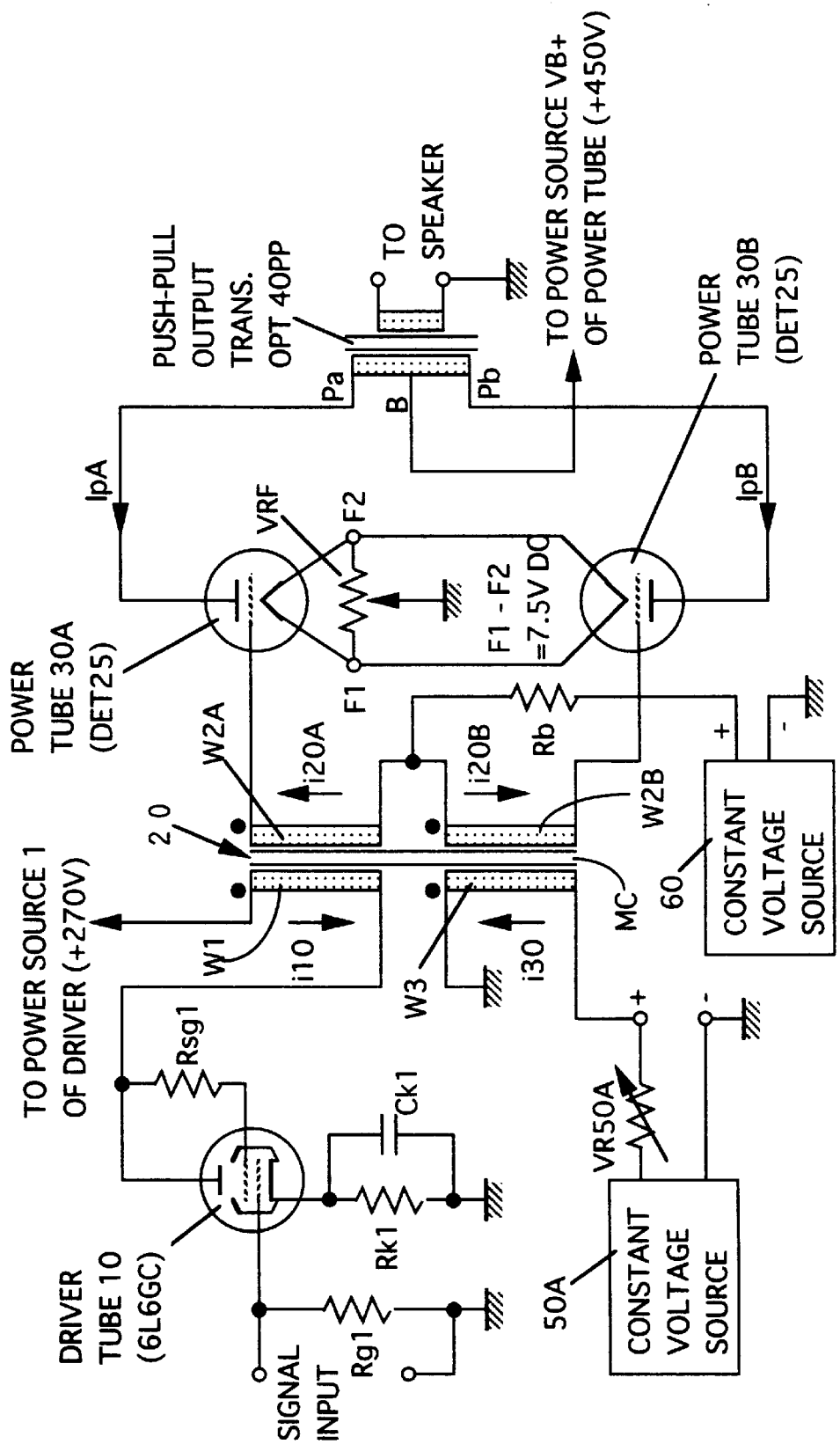
FIG. 10 is a circuit diagram for explaining a transformer-coupled amplifier (push-pull amplifier) in which the output stage is constituted by a pair of fixed positive bias directly heated type triode vacuum tubes (a grid current flows in the steady state) on the basis of the circuit shown in FIG. 1.

FIG. 10 shows a transformer-coupled amplifier (push-pull amplifier) in which the output stage is constituted by a fixed positive bias directly heated type triode vacuum tube (DET25 or a transmission tube having voltage amplification factor f, internal resistance rp of the plate, a plate loss, and filament emission which are almost equal to those of the DET25) on the basis of the circuit shown in FIG. 1. In this case, a 6L6GC beam tube having triode connection is used as drive signal source or driver tube 10, and a speaker (not shown) connected through push-pull output transformer OPT 40PP is used as load 40.

More specifically, the first grid of driver tube 10 is grounded through grid resistor Rg1, and an external signal input is applied across this grid resistor Rg1. The cathode of driver tube 10 is grounded through cathode resistor Rk1. Cathode bypass capacitor Ck1 is connected in parallel with this resistor Rk1, and the cathode of driver tube 10 is AC-grounded. The screen grid of driver tube 10 is connected to the plate of driver tube 10 through screen resistor Rsg1. The plate of driver tube 10 is connected to power source 1 of the driver (e.g., +270 V) through primary winding W1 of driver transformer 20.

The hot side of first secondary winding W2A of driver transformer 20 is connected to the control grid of first power tube 30A, and the cold side of first secondary winding W2A is connected to the positive terminal of constant voltage source 60 through resistor Rb (about 2.7 kΩ). Similarly, the host side of second secondary winding W2B of driver transformer 20 is connected to the control grid of second power tube 30B, and the cold side of second secondary winding W2B is connected to the positive terminal of constant voltage source 60 through resistor Rb. By these winding connections, the grid signal of first power tube 30A can be set to have an opposite phase to that of the grid signal of second power tube 30B. That is, push-pull drive signals of the power tubes can be phase-inverted.

The output voltage of power source 60 is set (e.g., about +30 V) such that the grid currents (secondary winding currents i20A and i20B of transformer 20) of two power tubes (DET25) 30A and 30B flow 10 mA each.

The plate of first power tube 30A is connected to primary winding terminal Pa of output transformer OPT 40PP, and the plate of second power tube 30B is connected to primary winding terminal Pb of output transformer OPT 40PP. Middle terminal B of output transformer OPT 40PP is connected to power source VB+ (+450 V) of the power tube.

A speaker having an impedance of about 4 Ω to 16 Ω is connected to the secondary winding of output transformer OPT 40PP. Hum balancer VRF is connected across the filaments of the pair of push-pull power tubes 30A and 30B. The slidable terminal of hum balancer VRF is grounded through self-bias resistor Rk2. Bypass capacitor Ck2 is connected in parallel with this resistor Rk2. The filaments of power tubes 30A and 30B are AC-grounded.

The filaments of power tubes 30A and 30B can be DC-ignited at 7.5 Vdc or AC-ignited at 7.5 Vac. In the push-pull amplifier, since the hum component of the filament of power tube 30A can be canceled by the hum component of the filament of power tube 30B, a hum-free state can be obtained by finely adjusting hum balancer VRF even in AC ignition.

Even in the push-pull amplifier, residual noise can be reduced in DC ignition of the filament. In this case, DC ignition of power tubes 30A and 30B is not limited to constant voltage ignition. The filaments of two power tubes 30 connected in parallel with each other may be ignited with a constant current twice the rated current.

In perfect DC constant current ignition, a filament hum is rarely generated, and therefore hum balancer VRF can be omitted. When hum balancer VRF is omitted, one of filament terminals F1 and F2 is directly grounded.

The hot side of tertiary winding (magnetization control winding) W3 of driver transformer 20 is grounded, and the cold side of tertiary winding W3 is connected to the positive terminal of constant voltage source 50A through variable resistor VR50A. The negative terminal of power source 50A is grounded.

In the above arrangement, grid currents i20A and i20B of power tubes 30A and 30B have the same magnitude but opposite flow directions in the steady state. DC magnetization of transformer 20 caused by plate current i10 of the driver tube cannot be canceled by currents i20A and i20B. DC magnetization of core MC of the magnetic circuit of transformer 20 which is caused by plate current i10 of the driver tube can be canceled by flowing appropriate current i30 to tertiary winding (magnetization control winding) W3.

When the ratio of the numbers of turns of windings W1, W2A+W2B, and W3 of transformer 20 is given by 1:0.5+0.5:1, and driver tube plate current i10 is given as 10 mA, magnetization control current i30 of 10 mA is flowed to winding W3 in a direction indicated by an arrow in FIG. 10 to allow cancellation of DC magnetization of core MC of transformer 20. In this case, if current i30 is limited to 7 mA, 3-mA DC magnetization of driver tube current (10 mA) i10 can be intentionally left. On the other hand, if current i30 is set at 12 mA, a magnetized state (2 mA in winding W3) opposite to DC magnetization caused by driver tube current (10 mA) i10 can be intentionally set.

The load impedance connected to winding W3 can be determined by resistor VR50A. Assume that the resistance of resistor VR50A is set to 4.7 kΩ, that the DC resistance of winding W3 is set to 220 Ω, and that magnetization control current i30 of 10 mA is flowed to winding W3. In this case, a voltage of +49.2 V is output from constant voltage source 50A. That is, after the predetermined magnitude of an AC load for driver tube 10 is given by resistor VR50A, the output voltage of power source 50A is so determined as to flow predetermined magnetization control current (magnetization cancellation current for the transformer core) i30 to winding W3 through resistor VR50A.

Alternatively, when the output voltage of constant voltage source 50A is fixed to, e.g., +50 V, and the resistance of variable resistor VR50A is adjusted between 2,280 Ω and 9,780 Ω (in this case, when the DC resistance of 220 Ω of winding W3 is added to the resistance of variable resistor VR50A, the resistance changes between 2.5 kΩ and 10 kΩ), magnetization control current can be arbitrarily adjusted between 20 mA and 5 mA. When this adjustment method is employed, both the magnitude of magnetization control current i30 and the magnitude of the load impedance for driver tube 10 change. A change in auditory sound quality of the entire amplifier in FIG. 10 occurs due to a change in state of DC magnetization cancellation of transformer core MC and a change in load impedance for driver tube 10.

The resistance of resistor VR50A and the magnitude of current i30 are appropriately changed in accordance with the measurement result of electrical characteristics (e.g., distortion and frequency characteristics) and the listening result after the power amplifier in FIG. 10 is finished.

Assume that driver tube current i10 of 15 mA flows in primary winding W1 when the rated primary current of transformer 20 is set to 30 mA. In this case, magnetization control current i30 of 15 mA need not necessarily be flowed to cancel DC magnetization of transformer core MC. The optimal points of distortion and frequency characteristics do not always coincide with the auditory optimal point. A sufficient sound quality improvement effect may be obtained even at magnetization control current i30 of −10 mA to +20 mA (this is not always true).

The push-pull amplifier circuit in FIG. 10 is not limited to the DET25. High-$\mu$, high-internal-impedance transmission tubes (e.g., RCA830) can be used as the push-pull power tubes 30A and 30B if the voltage of power source VB+ of the power tube and the output voltage of positive bias power source 60 are appropriately selected.

Figure 11:
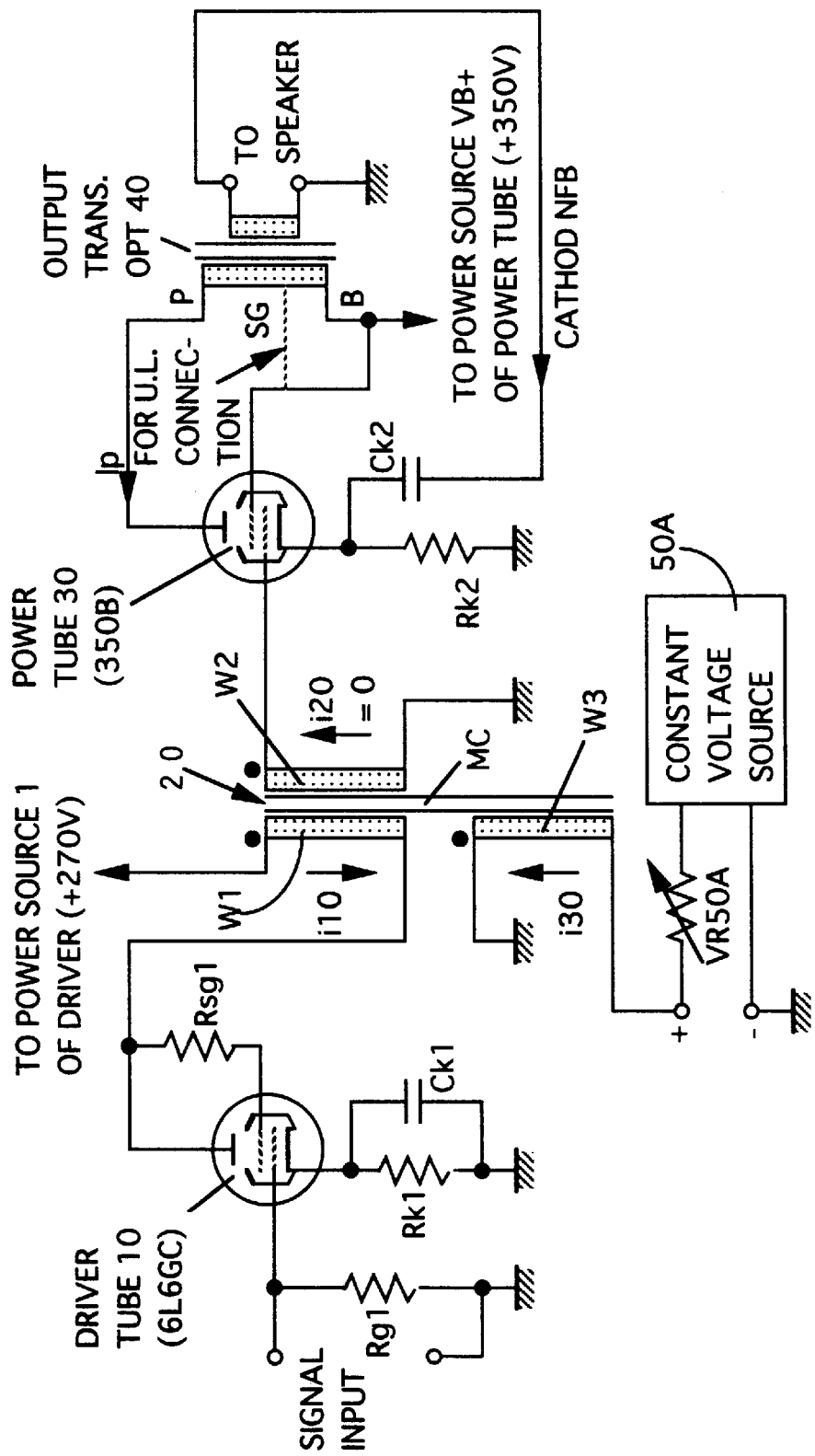
FIG. 11 is a circuit diagram for explaining a transformer-coupled amplifier (single amplifier with cathode NF) in which the output stage is constituted by a self-bias indirectly heated type multi-grids vacuum tube such as a beam tetrode or a pentode (no grid current in the steady state) on the basis of the circuit shown in FIG. 1.

FIG. 11 shows a transformer-coupled amplifier (single amplifier with cathode negative feedback) in which the output stage is constituted by a self-bias indirectly heated type triode vacuum tube (300B available from Western Electric, U.S.A. or its equivalent). In this case, a 6L6GC beam tube having triode connection is used as drive signal source or driver tube 10, and a speaker (not shown) connected through single output transformer OPT 40 is used as load 40.

More specifically, the first grid of driver tube 10 is grounded through grid resistor Rg1, and an external signal input is applied across this grid resistor Rg1. The cathode of driver tube 10 is grounded through cathode resistor Rk1. Cathode bypass capacitor Ck1 is connected in parallel with this resistor Rk1, and the cathode of driver tube 10 is AC-grounded. The screen grid of driver tube 10 is connected to the plate of driver tube 10 through screen resistor Rsg1. The plate of driver tube 10 is connected to power source 1 of the driver (e.g., +270 V) through primary winding W1 of driver transformer 20. The operation bias of driver tube 10 is given by a voltage drop of the sum (primary current i10 of transformer 20) of the plate current flowing through cathode resistor Rk1 and the screen grid current.

The hot side of secondary winding W2 of driver transformer 20 is connected to the control grid of power tube (350B) 30, and the cold side of secondary winding W2 is grounded. Power source VB+ (e.g., +350 V) of the power tube is applied to the plate of power tube 30 through the primary winding of output transformer OPT 40. The screen grid of power tube 30 is directly connected to power source VB+ of the power tube.

A speaker having an impedance of about 4 Ω to 16 Ω is connected to the secondary winding of output transformer OPT 40. The cathode of power tube 30 is grounded through self-bias resistor Rk2. The cathode of power tube 30 is also connected to one of the secondary windings of output transformer OPT 40 through bypass capacitor Ck2 (this connection is made to set the control grid signal of power tube 30 in phase with the feedback signal to this cathode).

The hot side of tertiary winding (magnetization control winding) W3 of driver transformer 20 is grounded, and the cold side tertiary winding W3 is connected to the positive terminal of constant voltage source 50A through variable resistor VR50A. The negative terminal of power source 50A is grounded.

In the above arrangement, since grid current i20 of power tube 30 is regarded as zero in the steady state, DC magnetization of core MC of the magnetic circuit of driver transformer 20 cannot be canceled by current i20. DC magnetization of core MC of the magnetic circuit of transformer 20 magnetized by driver tube plate current i10 can be canceled by flowing appropriate current i30 to tertiary winding (magnetization control winding) W3.

When the ratio of the numbers of turns of windings W1, W2, and W3 of transformer 20 is given by 1:2:1, and driver tube plate current i10 is given as 7 mA, magnetization control current i30 of 7 mA is flowed to winding W3 in a direction indicated by an arrow in FIG. 2 to allow cancellation of DC magnetization of core MC of transformer 20. In this case, if current i30 is limited to 5 mA, 2-mA DC magnetization of driver tube current (7 mA) i10 can be intentionally left. On the other hand, if current i30 is set at 10 mA, a magnetized state (3 mA in winding W3) opposite to DC magnetization caused by driver tube current (7 mA) i10 can be intentionally set.

The load impedance connected to winding W3 can be determined by resistor VR50A. Assume that the resistance of resistor VR50A is set to 5.6 kΩ, that the DC resistance of winding W3 is set to 400 Ω, and that magnetization control current i30 of 7 mA is flowed to winding W3. In this case, a voltage of +42 V is output from constant voltage source 50A.

That is, after the predetermined magnitude of an AC load for driver tube 10 is given by resistor VR50A, the output voltage of power source 50A is so determined as to flow predetermined magnetization control current (magnetization cancellation current for the transformer core) i30 to winding W3 through resistor VR50A.

Alternatively, when the output voltage of constant voltage source 50A is fixed to, e.g., +50 V, and the resistance of variable resistor VR50A is adjusted between 2.1 kΩ and 9.6 kΩ (in this case, when the DC resistance of 400 Ω of winding W3 is added to the resistance of variable resistor VR50A, the resistance changes between 2.5 kΩ and 10 kΩ), magnetization control current can be arbitrarily adjusted between 20 mA and 5 mA.

When this adjustment method is employed, both the magnitude of magnetization control current i30 and the magnitude of the load impedance for driver tube 10 change. A change in auditory sound quality of the entire amplifier in FIG. 11 occurs due to a change in state of DC magnetization cancellation of transformer core MC and a change in load impedance for driver tube 10. To avoid the sound quality change caused by the change in load impedance for driver tube 10, the resistance of resistor VR50A is fixed, and only the output voltage of constant voltage source 50A is changed.

The resistance of resistor VR50A and the magnitude of current i30 are appropriately changed in accordance with the measurement result of electrical characteristics (e.g., distortion and frequency characteristics) and the listening result after the power amplifier in FIG. 11 is finished.

The single amplifier circuit in FIG. 11 is not limited to the 350B even if the power tube is constituted by a similar negative bias indirectly heated type multi-grids tube. Another multi-grids tube (e.g., 6CA7, 6550, KT88, KT66, or 6L6GC) can be used as power tube 30 if the resistance of bias resistor Rk2, the voltage of power source VB+ of the power tube, and the primary impedance of output transformer OPT 40 are appropriately selected.

Power tube 30 in FIG. 11 is used in beam tube connection. However, when the screen grid tap (ultralinear UL connection terminal) is arranged in the primary winding of output transformer OPT 40, the screen grid of power tube 30 may be connected not to power source VB+ but to the ultralinear UL connection terminal. In this manner, when ultralinear UL connection is employed, cathode negative feedback from the secondary winding of output transformer OPT 40 to the cathode of power tube 30 through capacitor Ck2 may be omitted (in this case, bypass capacitor Ck2 is connected in parallel with cathode bias resistor Rk2).

Figure 12:
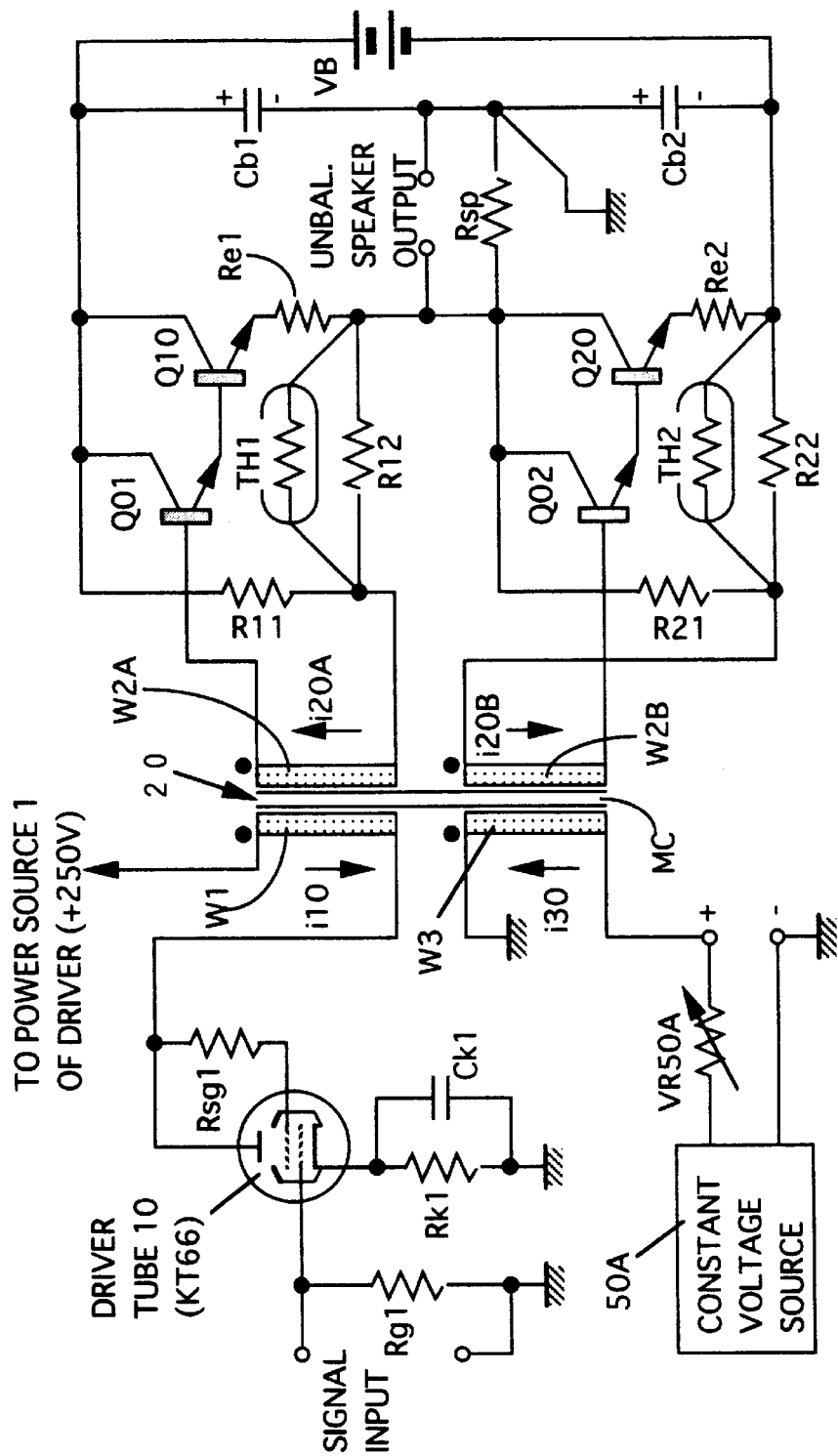
FIG. 12 is a circuit diagram for explaining a transformer-coupled amplifier in which the output stage is constituted by a single-end push-pull (SEPP) bipolar transistor (a base current flows in the steady state) on the basis of the circuit shown in FIG. 1.

FIG. 12 shows a transformer-coupled amplifier in which the output stage is constituted by a single-end push-pull (SEPP) arrangement using Darlington-connected bipolar transistors on the basis of the circuit shown in FIG. 1. Triode connection using a KT66 beam tube is used as drive signal source 10, and a speaker (not shown) is directly connected as load 40.

More specifically, the first grid of driver tube 10 is grounded through grid resistor Rg1, and an external signal input is applied across this grid resistor Rg1. The cathode of driver tube 10 is grounded through cathode resistor Rk1. Cathode bypass capacitor Ck1 is connected in parallel with this resistor Rk1, and the cathode of driver tube 10 is AC-grounded. The screen grid of driver tube 10 is connected to the plate of driver tube 10 through screen resistor Rsg1. The plate of driver tube 10 is connected to power source 1 of the driver (e.g., +250 V) through primary winding W1 of driver transformer 20 (the cold side of winding W1 is connected to the plate of driver tube 10). The operation bias of driver tube 10 is given by a voltage drop of the sum (primary current i10 of transformer 20) of the plate current flowing through cathode resistor Rk1 and the screen grid current.

The hot side of first secondary winding W2A of driver transformer 20 is connected to the base of npn drive transistor Q01, and the cold side of first secondary winding W2A is connected to the connection point between one terminal of resistor R11 and one terminal of resistor R12. The other terminal of resistor R11 is connected to the collector of transistor Q01, and the other terminal of resistor R12 is connected to one terminal of emitter resistor Re1. The other terminal of resistor Re1 is connected to the emitter of npn power transistor Q10. The base of transistor Q10 is connected to the emitter of transistor Q01, and the collector of transistor Q10 is connected to the collector of transistor Q01. Transistors Q10 and 01 are mounted on a heat sink (not shown). A thermistor TH1 having a negative temperature coefficient is connected in parallel with resistor R12, and this thermistor TH1 is thermally coupled to transistor Q10.

The cold side of second secondary winding W2B of driver transformer 20 is connected to the base of npn drive transistor Q02, and the hot side of the second secondary winding W2B is connected to the connection point between one terminal of resistor R21 and one terminal of resistor R22. The other terminal of resistor R21 is connected to the collector of transistor Q02, and the other terminal of resistor R22 is connected to one terminal of emitter resistor Re2. The other terminal of resistor Re2 is connected to the emitter of npn power transistor Q20. The base of transistor Q20 is connected to the emitter of transistor Q02, and the collector of transistor Q20 is connected to the collector of transistor Q02. Transistors Q20 and Q02 are mounted on a heat sink (not shown). Thermistor TH2 having a negative temperature coefficient is connected in parallel with resistor R22.

This thermistor TH2 is thermally coupled to transistor Q20.

The collector of transistor Q10 is connected to the positive side of large-capacitance power source capacitor (about several thousands of $\mu F$ to several ten thousands of $\mu F$) Cb1. One terminal of emitter resistor Re2 of transistor Q20 is connected to the negative side of large-capacitance power source capacitor (about several thousands of $\mu F$ to several ten thousands of $\mu F$) Cb2.

One terminal of emitter resistor Re1 of transistor Q10 is connected to the collector of transistor Q20, and the negative side of capacitor Cb1 is connected to the positive side of capacitor Cb2. The positive side of capacitor Cb1 and the negative side of capacitor Cb2 are connected to power source VB (more specifically, a voltage obtained by causing a diode bridge to rectify the secondary winding output from the power source transformer).

The negative side of capacitor Cb1 and the positive side of capacitor Cb2 are grounded. One terminal of emitter resistor Re1 of transistor Q10 and the collector of transistor Q20 are connected to the connection point between the negative side of capacitor Cb1 and the positive side of capacitor Cb2 through resistor Rsp (about several hundreds of Ω to several kΩ). A speaker driven by the amplifier in FIG. 12 is connected between the collector of transistor Q20 and the negative side of capacitor Cb1 (in other words, between one terminal of emitter resistor Re1 of transistor Q10 and the positive side of capacitor Cb2). Note that resistor Rsp has a function of preventing the collector circuit potential of transistor Q20 from being unstable when the speaker is not connected.

The host side of tertiary winding (magnetization control winding) W3 of driver transformer 20 is grounded, and the cold side of tertiary winding W3 is connected to the positive terminal of constant voltage source 50A through variable resistor VR50A. The negative terminal of power source 50A is grounded.

In the above arrangement, base current i20A of transistor Q01 and base current i20B of transistor Q02 have the same magnitude but opposite flow directions in the steady state. The current values of currents i20A and i20B are very small (assuming that current amplification factor HFE of transistors Q10 and Q20 is 100, that current amplification factor HFE of transistors Q01 and Q02 is 100, and that the collector idling current of transistors Q10 and Q20 is 1,000 mA, the magnitude of currents i20A and i20B becomes only 0.1 mA). For this reason, DC magnetization of transformer 20 magnetized by plate current i10 of the driver tube cannot be canceled by currents i20A and i20B. DC magnetization of core MC of a magnetic circuit of transformer 20 which is magnetized by plate current i10 of the driver tube can be canceled by flowing appropriate current i30 to tertiary winding (magnetization control winding) W3.

For example, when the ratio of the numbers of turns of windings W1, W2A+W2B, and W3 is given as 1:0.1+0.1:1, and plate current i10 of the driver tube is given as 20 mA, DC magnetization of the magnetic circuit of transformer 20 can be canceled by flowing magnetization control current i30 of 20 mA in a direction of an arrow in FIG. 12.

The load impedance connected to winding W3 can be determined by resistor VR50A. Assume that the resistance of resistor VR50A is set to 4.7 kΩ, that the DC resistance of winding W3 is set to 220 Ω, and that magnetization control current i30 of 20 mA is flowed to winding W3. In this case, a voltage of +98.4 V is output from constant voltage source 50A. That is, after the predetermined magnitude of an AC load for driver tube 10 is given by resistor VR50A, the output voltage of power source 50A is so determined as to flow predetermined magnetization control current i30 (magnetization cancellation current for the transformer core) to winding W3 through resistor VR50A.

Alternatively, when the output voltage of constant voltage source 50A is fixed to, e.g., +50 V, and the resistance of variable resistor VR50A is adjusted between 2,280 Ω and 9,780 Ω (in this case, when the DC resistance of 220 Ω of winding W3 is added to the resistance of variable resistor VR50A, the resistance changes between 2.5 kΩ and 10 kΩ), magnetization control current can be arbitrarily adjusted between 20 mA and 5 mA. When this adjustment method is employed, both the magnitude of magnetization control current i30 and the magnitude of the load impedance for driver tube 10 change. A change in auditory sound quality of the entire amplifier in FIG. 12 occurs due to a change in state of DC magnetization cancellation of transformer core MC and a change in load impedance for driver tube 10.

The resistance of resistor VR50A and the magnitude of current i30 are appropriately changed in accordance with the measurement result of electrical characteristics (e.g., distortion and frequency characteristics) and the listening result after the power amplifier in FIG. 12 is finished.

Note that a transformer-coupled amplifier can be arranged using transformer 20 with a magnetization control winding of the present invention even if transistors Q01 and Q10 are constituted by npn transistors and transistors Q02 and Q20 are constituted by pnp transistors to form a complementary SEPP.

Figure 13:
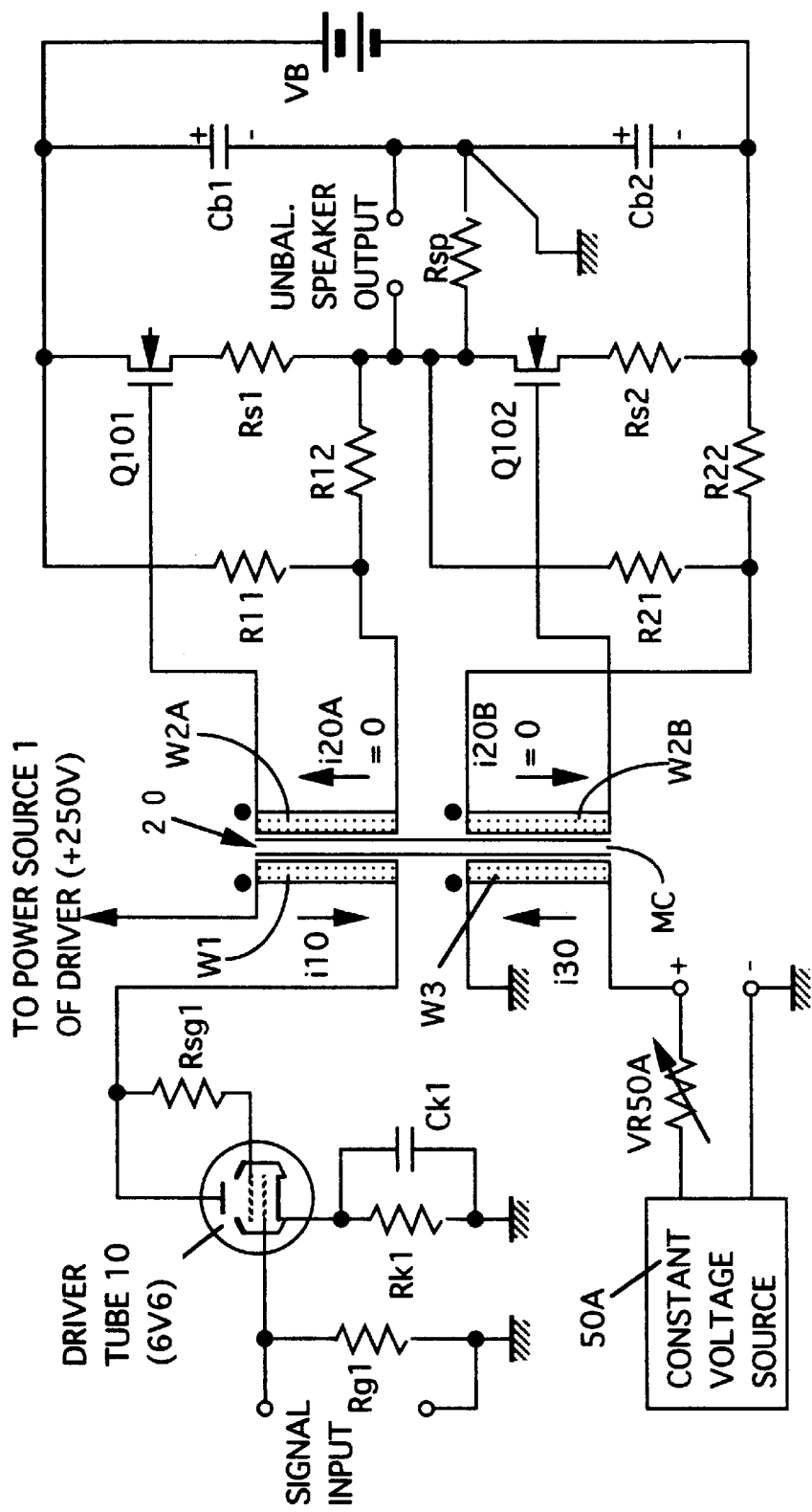
FIG. 13 is a circuit diagram for explaining a transformer-coupled amplifier in which the output stage is constituted by a single-end push-pull (SEPP) MOSFET transistor (no gate current in the steady state) on the basis of the circuit shown in FIG. 1.

FIG. 13 shows a transformer-coupled amplifier in which the output stage is constituted by a single-end push-pull (SEPP) arrangement using power MOSFETs on the basis of the circuit shown in FIG. 1. Triode connection using a 6V6 beam tube is used as drive signal source 10, and a speaker (not shown) is directly connected as load 40.

More specifically, the first grid of driver tube 10 is grounded through grid resistor Rg1, and an external signal input is applied across this grid resistor Rg1. The cathode of driver tube 10 is grounded through cathode resistor Rk1. Cathode bypass capacitor Ck1 is connected in parallel with this resistor Rk1, and the cathode of driver tube 10 is AC-grounded. The screen grid of driver tube 10 is connected to the plate of driver tube 10 through screen resistor Rsg1. The plate of driver tube 10 is connected to power source 1 of the driver (e.g., +250 V) through primary winding W1 of driver transformer 20 (the cold side of winding W1 is connected to the plate of driver tube 10). The operation bias of driver tube 10 is given by a voltage drop of the sum (primary current i10 of transformer 201 of the plate current flowing through cathode resistor Rk1 and the screen grid current.

The hot side of first secondary winding W2A of driver transformer 20 is connected to the gate of n-channel power MOS transistor Q101, and the cold side of first secondary winding W2A is connected to the connection point between one terminal of resistor R11 and one terminal of resistor R12. The other terminal of resistor R11 is connected to the drain of transistor Q101, and the other terminal of resistor R12 is connected to the one terminal of source resistor Rs1. The other terminal of resistor Rs1 is connected to the source of transistor Q101. Transistor Q101 is mounted on a heat sink (not shown).

The cold side of second secondary winding W2B of driver transformer 20 is connected to the gate of n-channel power MOS transistor Q102, and the hot side of second secondary winding W2B is connected to the connection point between one terminal of resistor R21 and one terminal of resistor R22. The other terminal of resistor R21 is connected to the drain of transistor Q102, and the other terminal of resistor R22 is connected to one terminal of source resistor Rs2. The other terminal of resistor Rs2 is connected to the source of transistor Q102. Transistor Q102 is mounted on a heat sink (not shown).

The drain of transistor Q101 is connected to the positive side of large-capacitance power source capacitor (about several thousands of $\mu$F to several ten thousands of $\mu$F) Cb1. One terminal of source resistor Rs2 of transistor Q102 is connected to the negative side of large-capacitance power source capacitor (about several thousands of $\mu$F to several ten thousands of $\mu$F) Cb2.

One terminal of source resistor Rs1 of transistor Q101 is connected to the drain of transistor Q102, and. the negative side of capacitor Cb1 is connected to the positive side of capacitor Cb2. The positive side of capacitor Cb1 and the negative side of capacitor Cb2 are connected to power source VB (more specifically, a voltage obtained by causing a diode bridge to rectify the secondary winding output from the power source transformer).

The negative side of capacitor Cb1 and the positive side of capacitor Cb2 are grounded. One terminal of source resistor Rs1 of transistor Q101 and the drain of transistor Q102 are connected to the connection point between the negative side of capacitor Cb1 and the positive side of capacitor Cb2 through resistor Rsp (about several hundreds of Ω to several kΩ). A speaker driven by the amplifier in FIG. 13 is connected between the drain of transistor Q102 and the negative side of capacitor Cb1 (in other words, between one terminal of source resistor Rs1 of transistor Q101 and the positive side of capacitor Cb2). Note that resistor Rsp has a function of preventing the drain circuit potential of transistor Q102 from being unstable when the speaker is not connected.

The host side of tertiary winding (magnetization control winding) W3 of driver transformer 20 is grounded, and the cold side of tertiary winding W3 is connected to the positive terminal of constant voltage source 50A through variable resistor VR50A. The negative terminal of power source 50A is grounded.

In the above arrangement, gate current i20A of transistor Q101 and gate current i20B of transistor Q102 are almost zero. DC magnetization of transformer 20 magnetized by plate current i10 of the driver tube cannot be canceled by currents i20A and i20B. DC magnetization of core MC of a magnetic circuit of transformer 20 which is magnetized by plate current i10 of the driver tube can be canceled by flowing appropriate current i30 to tertiary winding (magnetization control winding) W3.

For example, when the ratio of the numbers of turns of windings W1, W2A+W2B, and W3 is given as 1:0.5+0.5:1, and plate current i10 of the driver tube is given as 10 mA, DC magnetization of the magnetic circuit of transformer 20 can be canceled by flowing magnetization control current i30 of 10 mA in a direction of an arrow in FIG. 13.

The load impedance connected to winding W3 can be determined by resistor VR50A. Assume that the resistance of resistor VR50A is set to 4.7 kΩ, that the DC resistance of winding W3 is set to 220 Ω, and that magnetization control current i30 of 10 mA is flowed to winding W3. In this case, a voltage of +49.2 V is output from constant voltage source 50A. That is, after the predetermined magnitude of an AC load for driver tube 10 is given by resistor VR50A, the output voltage of power source 50A is so determined as to flow predetermined magnetization control current (magnetization cancellation current for the transformer core) i30 to winding W3 through resistor VR50A.

Alternatively, when the output voltage of constant voltage source 50A is fixed to, e.g., +25 V, and the resistance of variable resistor VR50A is adjusted between 2,280 Ω and 9,780 Ω (in this case, when the DC resistance of 220 Ω of winding W3 is added to the resistance of variable resistor VR50A, the resistance changes between 2.5 kΩ and 10 kΩ), magnetization control current can be arbitrarily adjusted between 10 mA and 2.5 mA. When this adjustment method is employed, both the magnitude of magnetization control current i30 and the magnitude of the load impedance for driver tube 10 change. A change in auditory sound quality of the entire amplifier in FIG. 13 occurs due to a change in state of DC magnetization cancellation of transformer core MC and a change in load impedance for driver tube 10.

The resistance of resistor VR50A and the magnitude of current i30 are appropriately changed in accordance with the measurement result of electrical characteristics (e.g., distortion and frequency characteristics) and the listening result after the power amplifier in FIG. 13 is finished.

Note that a transformer-coupled amplifier can be arranged using transformer 20 with a magnetization control winding of the present invention even if transistor Q101 is constituted by an n-channel transistor and transistor Q102 is constituted by a p-channel transistor to form a complementary SEPP.

When driver tube 10 is constituted by an n-channel FET, a transformer-coupled all-FET amplifier can be arranged.

In the amplifier shown in FIG. 12 or 13, when the ground terminal (ground terminal as one terminal of the speaker) on the SEPP output side is separated from the ground terminal on the driver tube 10 side, a ground separation type broadband unbalanced amplifier can be obtained.

Figure 14:
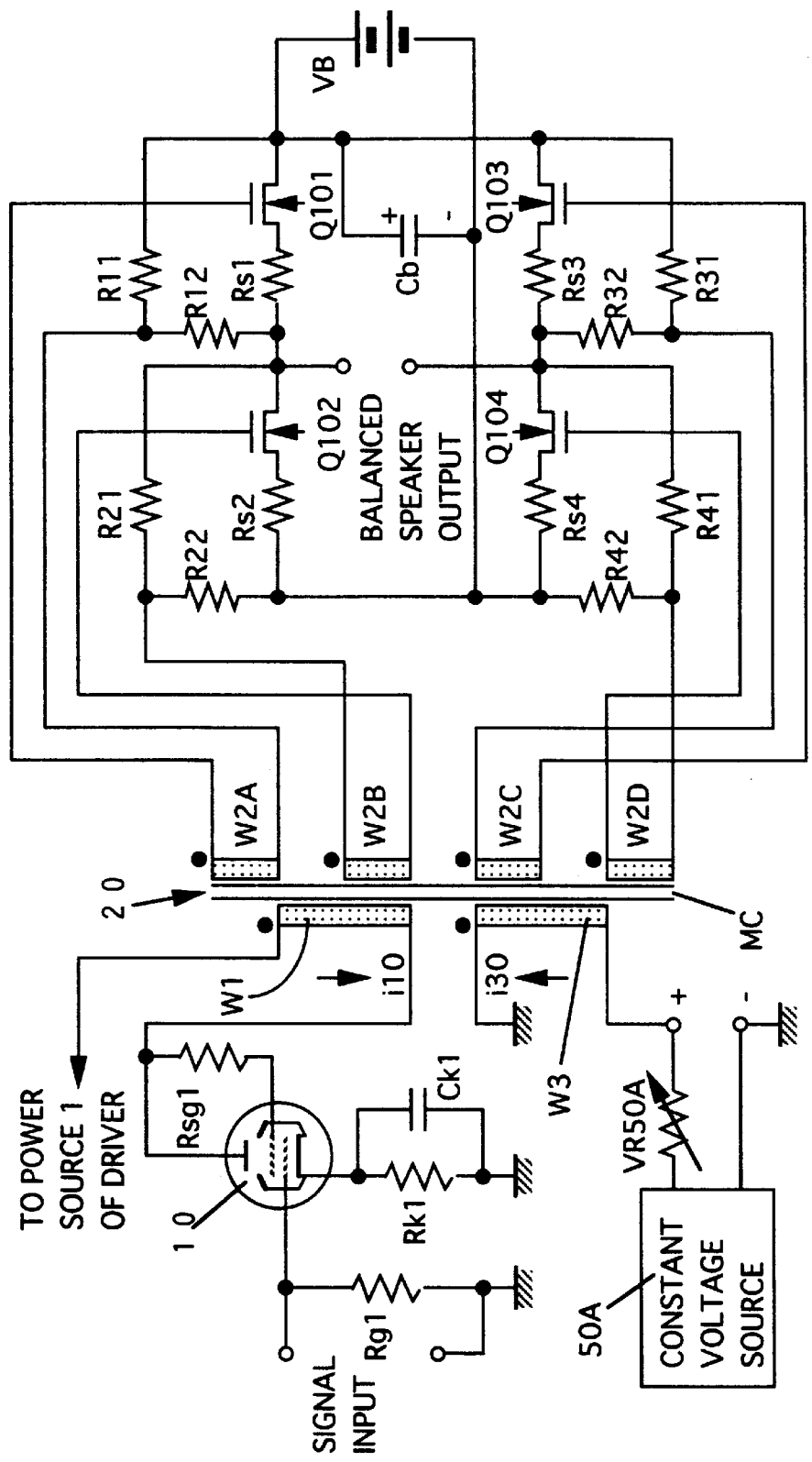
FIG. 14 is a circuit diagram for explaining a transformer-coupled amplifier in which the output stage is constituted by bridge-connected (or BTL-connected) push-pull (SEPP) MOSFET transistors (no gate current in the steady state) as a modification of FIG. 13.

FIG. 14 is a modification of FIG. 13 and shows a transformer-coupled amplifier in which the output stage is constituted by bridge-connected (or BTL-connected) power MOSFETs. The circuit arrangement of the driver tube is identical to that in FIG. 13.

The hot side of first secondary winding W2A of driver transformer 20 is connected to the gate of n-channel power MOS transistor Q101, and the cold side of first secondary winding W2A is connected to the connection point between one terminal of resistor R11 and one terminal of resistor R12. The other terminal of resistor R11 is connected to the drain of transistor Q101, and the other terminal of resistor R12 is connected to the one terminal of source resistor Rs1. The other terminal of resistor Rs1 is connected to the source of transistor Q101. Transistor Q101 is mounted on a heat sink (not shown).

The cold side of second secondary winding W2B of driver transformer 20 is connected to the gate of n-channel power MOS transistor Q102, and the hot side of second secondary winding W2B is connected to the connection point between one terminal of resistor R21 and one terminal of resistor R22. The other terminal of resistor R21 is connected to the drain of transistor Q102, and the other terminal of resistor R22 is connected to one terminal of source resistor Rs2. The other terminal of resistor Rs2 is connected to the source of transistor Q102. Transistor Q102 is mounted on a heat sink (not shown).

The cold side of third secondary winding W2C of driver transformer 20 is connected to the gate of n-channel power MOS transistor Q103, and the hot side of third secondary winding W2C is connected to the connection point between one terminal of resistor R31 and one terminal of resistor R32. The other terminal of resistor R31 is connected to the drain of transistor Q103, and the other terminal of resistor R32 is connected to one terminal of source resistor Rs3. The other terminal of resistor Rs3 is connected to the source of transistor Q103. Transistor Q103 is mounted on a heat sink (not shown).

The hot side of fourth secondary winding W2D of driver transformer 20 is connected to the gate of n-channel power MOS transistor Q104, and the cold side of fourth secondary winding W2D is connected to the connection point between one terminal of resistor R41 and one terminal of resistor R42. The other terminal of resistor R41 is connected to the drain of transistor Q104, and the other terminal of resistor R42 is connected to one terminal of source resistor Rs4. The other terminal of resistor Rs4 is connected to the source of transistor Q104. Transistor Q104 is mounted on a heat sink (not shown).

The drains of transistors Q101 and Q103 are connected to the positive side of large-capacitance power source capacitor (about several thousands of μF to several ten thousands of μF) Cb. One terminal of source resistor Rs2 of transistor Q102 and one terminal of source resistor Rs4 of transistor Q104 are connected to the negative side of large-capacitance power source capacitor (about several thousands of μF to several ten thousands of μF) Cb. One terminal of source resistor Rs1 of transistor Q101 is connected to the drain of transistor Q102, and one terminal of source resistor Rs3 of transistor Q103 is connected to the drain of transistor Q104.

A speaker driven by the amplifier in FIG. 14 is connected between the drain of transistor Q102 and one terminal of source resistor Rs3 of transistor Q103 (in other words, between one terminal of source resistor Rs1 of transistor Q101 and the drain of transistor Q104).

The hot side of tertiary winding (magnetization control winding) W3 of driver transformer 20 is grounded, and the cold side of tertiary winding W3 is connected to the positive terminal of constant voltage source 50A through variable resistor VR50A. The negative terminal of power source 50A is grounded.

In the above arrangement, the gate currents of MOS transistors Q101 to Q104 are almost zero. DC magnetization of transformer 20 magnetized by plate current i10 of the driver tube cannot be canceled by the currents of first secondary winding W2A to fourth secondary winding W2D. DC magnetization of core MC of a magnetic circuit of transformer 20 generated by plate current i10 of the driver tube can be canceled by appropriate current i30 to tertiary winding (magnetization control winding) W3.

For example, when the ratio of the numbers of turns of windings W1, W2A+W2B+W2C+W2D, and W3 is given as 1:0.5+0.5+0.5+0.5:1, and plate current i10 of the driver tube is given as 10 mA, DC magnetization of the magnetic circuit of transformer 20 can be canceled by flowing magnetization control current i30 of 10 mA in a direction of an arrow in FIG. 14.

The load impedance connected to winding W3 can be determined by resistor VR50A. Assume that the resistance of resistor VR50A is set to 4.7 kΩ, that the DC resistance of winding W3 is set to 220 Ω, and that magnetization control current i30 of 10 mA is flowed to winding W3. In this case, a voltage of +49.2 V is output from constant voltage source 50A. That is, after the predetermined magnitude of an AC load for driver tube 10 is given by resistor VR50A, the output voltage of power source 50A is so determined as to flow predetermined magnetization control current (magnetization cancellation current for the transformer core) i30 to winding W3 through resistor VR50A.

Alternatively, when the output voltage of constant voltage source 50A is fixed to, e.g., +25 V, and the resistance of variable resistor VR50A is adjusted between 2,280 Ω and 9,780 Ω (in this case, when the DC resistance of 220 Ω of winding W3 is added to the resistance of variable resistor VR50A, the resistance changes between 2.5 kΩ and 10 kΩ), magnetization control current can be arbitrarily adjusted between 10 mA and 2.5 mA. When this adjustment method is employed, both the magnitude of magnetization control current i30 and the magnitude of the load impedance for driver tube 10 change. A change in auditory sound quality of the entire amplifier in FIG. 14 occurs due to a change in state of DC magnetization cancellation of transformer core MC and a change in load impedance for driver tube 10.

The resistance of resistor VR50A and the magnitude of current i30 are appropriately changed in accordance with the measurement result of electrical characteristics (e.g., distortion and frequency characteristics) and the listening result after the power amplifier in FIG. 14 is finished.

Note that a transformer-coupled amplifier can be arranged using transformer 20 with a magnetization control winding of the present invention even if transistors Q101 and Q103 constituted by n-channel transistors and transistors Q102 and Q104 are constituted by p-channel transistors to form a complementary SEPP.

When driver tube 10 is constituted by an n-channel FET, a transformer-coupled all-FET·BTL (bridge) amplifier can be arranged.

Note that when MOS transistor Q101 is constituted by an n-channel transistor and MOS transistor Q102 is constituted by a p-channel transistor to arrange a first complementary SEPP arrangement, MOS transistors Q101 and Q102 can be driven by a common in-phase signal, thereby omitting one of secondary windings W2A and W2B of transformer 20.

Similarly, when MOS transistor Q103 is constituted by an n-channel transistor and MOS transistor Q104 is constituted by a p-channel transistor to arrange a second complementary SEPP arrangement, MOS transistors Q103 and Q104 can be driven by a common opposite-phase signal, thereby omitting one of secondary windings W2C and W2D of transformer 20.

Since the output side (the two terminals of the speaker) in the BTL amplifier in FIG. 14 floats from ground and has a balanced output, separation of output-side ground (not shown) from ground on the driver tube 10 allows arrangement of a ground separation broad-band balanced amplifier.

In each embodiment illustrated above, an active element for driving driver transformer 20 is a triode-connected beam tube. This drive element may be a multi-grids tube without triode connection, a pure triode, a bipolar transistor, or a field effect transistor of any type (e.g., a junction FET, a V-FET, or a MOSFET).

The primary drive signal of driver transformer 20 may be extracted from a cathode circuit in place of a vacuum tube plate circuit.

According to the present invention, there is provided a transformer-coupled amplifier (wide-band amplifier system) for performing wide-band power transmission from the low frequency to the high frequency of AC signals distributed in a wide frequency range without using a coupling capacitor unlike in the Clarf scheme by eliminating or reducing DC magnetization of the magnetic circuit of the transformer while flowing a DC current to the primary winding of the coupling transformer. The detailed applications of the present invention will be exemplified as follows:

(1) a transformer-coupled vacuum tube single power amplifier (e.g., FIGS. 2, 8, and 11);

(2) a transformer-coupled vacuum tube or semiconductor push-pull amplifier whose coupling transformer is used in phase inversion (e.g., FIGS. 9, 10, and 12 to 14);

(3) a transformer-coupled wide-band amplifier using a vacuum tube or semiconductor (for example, in FIG. 8 or 13, when a video amplification high-gm tube or high-gm FET having a low internal resistance and excellent high-frequency characteristics is used as driver tube 10, and the primary/secondary impedance of transformer 20 is set low, a wide-band transformer-coupled amplifier can be obtained);

(4) a ground separation wide-band balanced amplifier (for example, in the arrangement of FIG. 9, a balanced output is extracted from a pair of series-connected secondary windings W2A and W2B of transformer 20, and ground of the connection point/center tap of the pair of secondary windings W2A and W2B is separated from the ground circuit of driver tube 10); and (5) a ground separation wide-band unbalanced amplifier (for example, in the arrangement of FIG. 2, a balanced output is extracted from the hot side of secondary winding W2 of transformer 20, and cold-side ground of secondary winding W2 is separated from the ground circuit of driver tube 10).

According to the present invention, even if DC current i10 is flowed in primary winding W1 of coupling transformer 20, current i30 is flowed to magnetization control winding W3 in a direction to cancel DC magnetization generated by current i10. The magnetic circuit of transformer 20 can be made of a high-permeability magnetic material without a gap (or a narrow gap). The size of the core of the transformer can be made compact while a relatively large primary inductance is maintained. The winding size can be made compact accordingly. As a result, a transformer-coupled amplifier having a wide transmission frequency range (i.e., wide range) can be obtained.

The DC magnetized state of transformer 20 can be arbitrarily adjusted by magnetization control current i30 flowed in magnetization control winding W3. Therefore, the characteristics (FIGS. 3 to 7) of the entire amplifier including transformer 20 can be variously changed.

The internal resistance (VR50A or VR50B in FIG. 1) of power source 50 for supplying magnetization control current i30 to magnetization control winding W3 is adjusted to allow a change in AC load state for driver tube 10. This adjustment of the AC load state allows a change in distortion generation state of driver tube 10. As a result, the secondary distortion canceling amount of power tube 30 which is caused by the secondary distortion of driver tube 10 can be arbitrarily controlled.

When the internal resistance (VR50A or VR50B in FIG. 1) of DC magnetization control power source 50 and the magnitude of magnetization control current i30 are appropriately adjusted, the distortion/frequency characteristics of the entire amplifier can be balanced, thereby realizing high-efficiency power transmission using compact wide-band transformer 20.

Even if drive signal source 10 of the transformer is a single-end source, phase inversion, balanced output, and ground separation can be easily realized using compact wide-band transformer 20.

The present invention can also be used for driving a power IC using a transformer in a three-phase 200-V inverter or the like. More specifically, a current for driving the power IC is extracted from driver transformer 20 having a DC magnetization control winding. When transformer 20 is to be DC-magnetized by this drive circuit, an appropriate current is flowed in the DC magnetization control winding to cancel this DC magnetization. Therefore, even if compact transformer 20 having no air gap in an unbalanced state of the primary/secondary current is used, the power IC can be sufficiently driven while preventing DC magnetization of the core of the transformer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A transformer-coupled amplifier comprising:

a driver transformer in which a primary winding, a secondary winding, and a tertiary winding are wound on a core of a magnetic circuit;

a drive signal source for supplying an AC drive signal superposed with a drive-stage DC current to said primary winding of said driver transformer;

output means for extracting, from said secondary winding of said driver transformer, an AC signal corresponding to the AC drive signal supplied to said primary winding of said driver transformer, and for amplifying the AC signal from said secondary winding; and DC magnetization control means for supplying a predetermined magnetization control current to said tertiary winding of said driver transformer so as to change a degree of DC magnetization of said core of said magnetic circuit of said driver transformer, wherein a DC magnetized state of said core of said magnetic circuit of said driver transformer magnetized by the drive-stage DC current is changed by the magnetization control current so as to obtain a predetermined state.

2. A transformer-coupled amplifier comprising:

a driver transformer in which a primary winding, a secondary winding, and a tertiary winding are wound on a core of a magnetic circuit;

a drive signal source for supplying an AC drive signal superposed with a drive-stage DC current to said primary winding of said driver transformer;

output means for extracting, from said secondary winding of said driver transformer, an AC signal corresponding to the AC drive signal supplied to said primary winding of said driver transformer, and for amplifying the AC signal from said secondary winding; and DC magnetization control means for supplying a predetermined magnetization control current to said tertiary winding of said driver transformer so as to change a degree of DC magnetization of said core of said magnetic circuit of said driver transformer, said DC magnetization control means having a predetermined internal impedance, wherein the DC magnetization control current is flowed to said tertiary winding of said driver transformer so as to obtain a state in which the degree of DC magnetization of said core of said magnetic circuit of said drive transformer is reduced, and a magnitude of the magnetization control current flowing in said tertiary winding of said driver transformer and the internal impedance of said DC magnetization control means are selected such that amplifier characteristics including frequency response characteristics of said primary and secondary windings of said driver transformer are set to predetermined characteristics.

3. A transformer-coupled amplifier comprising:

a driver transformer in which a primary winding, a first secondary winding, a second secondary winding, and a tertiary winding are wound on a core of a magnetic circuit;

a drive signal source for supplying an AC drive signal superposed with a drive-stage DC current to said primary winding of said driver transformer;

first output means for extracting, from said first secondary winding of said driver transformer, a first AC signal corresponding to the AC drive signal supplied to said primary winding of said driver transformer, and for amplifying the first AC signal from said first secondary winding;

second output means for extracting, from said second secondary winding of said driver transformer, a second AC signal having a phase opposite to that of the first AC signal and corresponding to the AC drive signal supplied to said primary winding of said driver transformer, and for amplifying the second AC signal from said second secondary winding;

output synthesizing means for synthesizing and outputting a first output from said first output means which has amplified the first AC signal and a second output from said second output means which has amplified the second AC signal; and DC magnetization control means for providing a predetermined magnetization control current to said tertiary winding of said driver transformer so as to change a degree of DC magnetization of said core of said magnetic circuit of said driver transformer, wherein a DC magnetized state of said core of said magnetic circuit of said driver transformer magnetized by the drive-stage DC current is changed by the magnetization control current so as to obtain a predetermined state.

4. A transformer-coupled amplifier comprising:

a driver transformer in which a primary winding, a first secondary winding, a second secondary winding, and a tertiary winding are wound on a core of a magnetic circuit;

a drive signal source for supplying an AC drive signal superposed with a drive-stage DC current to said primary winding of said driver transformer;

first output means for extracting, from said first, secondary winding of said driver transformer, a first AC signal corresponding to the AC drive signal supplied to said primary winding of said driver transformer, and for amplifying the first AC signal from said first secondary winding;

second output means for extracting, from said second secondary winding of said driver transformer, a second AC signal having a phase opposite to that of the first AC signal and corresponding to the AC drive signal supplied to said primary winding of said driver transformer, and for amplifying the second AC signal from said second secondary winding;

output synthesizing means for synthesizing and outputting a first output from said first output means which has amplified the first AC signal and a second output from said second output means which has amplified the second AC signal; and DC magnetization control means for providing a predetermined magnetization control current to said tertiary winding of said driver transformer so as to change a degree of DC magnetization of said core of said magnetic circuit of said driver transformer, wherein the DC magnetization control current is flowed to said tertiary winding of said driver transformer so as to obtain a state in which the degree of DC magnetization of said core of said magnetic circuit of said drive transformer is reduced, and a magnitude of the magnetization control current flowing in said tertiary winding of said driver transformer and an internal impedance of said DC magnetization control means are selected such that amplifier characteristics including frequency response characteristics of said primary and secondary windings of said driver transformer are set to predetermined characteristics.

5. A transformer-coupled amplifier comprising:

a driver transformer in which a primary winding, a secondary winding, and a tertiary winding are wound on a core of a magnetic circuit;

a drive signal source for supplying an AC drive signal superposed with a drive-stage DC current to said primary winding of said driver transformer;

output means for extracting, from said secondary winding of said driver transformer, an AC signal corresponding to the AC drive signal supplied to said primary winding of said driver transformer, and for amplifying the AC signal from said secondary winding;

bias means for supplying a DC bias current to said output means through said secondary winding of said driver transformer in a direction to reduce a degree of DC magnetization of said core of said magnetic circuit magnetized by the drive-stage DC current flowed in said primary winding of said driver transformer; and DC magnetization control means for supplying a predetermined magnetization control current to said tertiary winding of said driver transformer so as to change the degree of DC magnetization of said core of said magnetic circuit of said driver transformer, wherein a DC magnetized state of said core of said magnetic circuit of said driver transformer magnetized by the drive-stage DC current is changed by the magnetization control current and the DC bias current so as to obtain a predetermined state.

6. A transformer-coupled amplifier comprising:

a driver transformer in which a primary winding, a secondary winding, and a tertiary winding are wound on a core of a magnetic circuit;

a drive signal source for supplying an AC drive signal superposed with a drive-stage DC current to said primary winding of said driver transformer;

output means for extracting, from said secondary winding of said driver transformer, an AC signal corresponding to the AC drive signal supplied to said primary winding of said driver transformer, and for amplifying the AC signal from said secondary winding;

bias means for supplying a DC bias current to said output means through said secondary winding of said driver transformer in a direction to reduce a degree of DC magnetization of said core of said magnetic circuit magnetized by the drive-stage DC current flowed in said primary winding of said driver transformer; and DC magnetization control means for supplying a predetermined magnetization control current to said tertiary winding of said driver transformer so as to change the degree of DC magnetization of said core of said magnetic circuit of said driver transformer, wherein a magnitude of the magnetization control a current flowing in said tertiary winding of said driver transformer and an internal impedance of said DC magnetization control means are selected such that amplifier characteristics including frequency response characteristics of said primary and secondary windings of said driver transformer are set to predetermined characteristics.

7. A transformer-coupled amplifier comprising:

a driver transformer in which a primary winding, a first secondary winding, a second secondary winding, and a tertiary winding are wound on a core of a magnetic circuit;

a drive signal source for supplying an AC drive signal superposed with a drive-stage DC current to said primary winding of said driver transformer;

first output means for extracting from said first secondary winding of said driver transformer, a first AC signal corresponding to the AC drive signal supplied to said primary winding of said driver transformer, and for amplifying the first AC signal from said first secondary winding;

second output means for extracting, from said second secondary winding of said driver transformer, a second AC signal having a phase opposite to the first AC signal and corresponding to the AC drive signal supplied to said primary winding of said driver transformer, and for amplifying the second AC signal from said second secondary winding;

output synthesizing means for synthesizing and outputting a first output from said first output means which has amplified the first AC signal and a second output from said second output means which has amplified the second AC signal;

bias means for supplying a first DC bias current to said first output means through said first secondary winding of said driver transformer and a second DC bias current to said second output means through said second secondary winding of said driver transformer; and DC magnetization control means for providing a predetermined magnetization control current to said tertiary winding of said driver transformer so as to change a degree of DC magnetization of said core of said magnetic circuit of said driver transformer, wherein the DC magnetized state of said core of said magnetic circuit of said driver transformer magnetized by the drive-stage DC current is changed by the magnetization control current so as to obtain a predetermined state.

8. A transformer-coupled amplifier comprising:

a driver transformer in which a primary winding, a first secondary winding, a second secondary winding, and a tertiary winding are wound on a core of a magnetic circuit;

a drive signal source for supplying an AC drive signal superposed with a drive-stage DC current to said primary winding of said driver transformer;

first output means for extracting, from said first secondary winding of said driver transformer, a first AC signal corresponding to the AC drive signal supplied to said primary winding of said driver transformer, and for amplifying the first AC signal from said first secondary winding;

second output means for extracting, from said second secondary winding of said driver transformer, a second AC signal having a phase opposite to the first AC signal and corresponding to the AC drive signal supplied to said primary winding of said driver transformer, and for amplifying the second AC signal from said second secondary winding;

output synthesizing means for synthesizing and outputting a first output from said first output means which has amplified the first AC signal and a second output from said second output means which has amplified the second AC signal;

bias means for supplying a first DC bias current to said first output means through said first secondary winding of said driver transformer and a second DC bias current to said second output means through said second secondary winding of said driver transformer; and DC magnetization control means for providing a predetermined magnetization control current to said tertiary winding of said driver transformer so as to change a degree of DC magnetization of said core of said magnetic circuit of said driver transformer, wherein a magnitude of the magnetization control current flowing in said tertiary winding of said driver transformer and an internal impedance of said DC magnetization control means are selected such that amplifier characteristics including frequency response characteristics of said primary and secondary windings of said driver transformer are set to predetermined characteristics.

9. An amplifier according to any one of claims 1 to 8, wherein said DC magnetization control means includes a constant voltage source having a predetermined internal resistance.

10. An amplifier according to any one of claims 1 to 8, wherein said DC magnetization control means includes a constant current source having a predetermined internal resistance.

11. A transformer-coupled amplifier comprising:

a driver transformer in which a primary winding, a secondary winding, and a tertiary winding are wound on a core of a magnetic circuit;

a drive signal source for supplying an AC drive signal superposed with a drive-stage DC current to said primary winding of said driver transformer;

a triode having a grid connected to said secondary winding of said driver transformer, a plate connected to a load, and a cathode or filament to amplify an AC signal generated by said secondary winding, said triode having a grid potential negatively biased with respect to said cathode or filament; and DC magnetization control means for supplying a predetermined magnetization control current to said tertiary winding of said driver transformer so as to change a degree of DC magnetization of said core of said magnetic circuit of said driver transformer, wherein a DC magnetized state of said core of said magnetic circuit of said driver transformer magnetized by the drive-stage DC current is changed by the magnetization control current so as to obtain a predetermined state.

12. A transformer-coupled amplifier comprising:

a driver transformer in which a primary winding, a secondary winding, and a tertiary winding are wound on a core of a magnetic circuit;

a drive signal source for supplying an AC drive signal superposed with a drive-stage DC current to said primary winding of said driver transformer;

a triode having a grid connected to said secondary winding of said driver transformer, a plate connected to a load, and a cathode or filament to amplify an AC signal generated by said secondary winding, said triodes having a grid potential positively biased with respect to said cathode or filament; and DC magnetization control means for supplying a predetermined magnetization control current to said tertiary winding of said driver transformer so as to change a degree of DC magnetization of said core of said magnetic circuit of said driver transformer, wherein a DC magnetized state of said core of said magnetic circuit of said driver transformer magnetized by the drive-stage DC current is changed by the magnetization control current so as to obtain a predetermined state.

13. A transformer-coupled amplifier comprising:

a driver transformer in which a primary winding, a secondary winding, and a tertiary winding are wound on a core of a magnetic circuit;

a drive signal source for supplying an AC drive signal superposed with a drive-stage DC current to said primary winding of said driver transformer;

a multi-grids tube having a first grid connected to said secondary winding of said driver transformer, a second grid structurally independent of said first grid, a plate connected to a load, and a cathode or filament to amplify an AC signal generated by said secondary winding, said multi-grids tube having a grid potential negatively biased with respect to said cathode or filament; and DC magnetization control means for supplying a predetermined magnetization control current to said tertiary winding of said driver transformer so as to change a degree of DC magnetization of said core of said magnetic circuit of said driver transformer, wherein a DC magnetized state of said core of said magnetic circuit of said driver transformer magnetized by the drive-stage DC current is changed by the magnetization control current so as to obtain a predetermined state.

14. A transformer-coupled amplifier comprising:

a driver transformer in which a primary winding, a first secondary winding, a second secondary winding, and a tertiary winding are wound on a core of a magnetic circuit;

a drive signal source for supplying an AC drive signal superposed with a drive-stage DC current to said primary winding of said driver transformer;

a first triode having a grid connected to said first secondary winding of said driver transformer, a plate connected to one terminal of a load, and a cathode or filament to amplify a first AC signal generated by said first secondary winding, said first triode having a grid potential negatively biased with respect to said cathode or filament;

a second triode having a grid connected to said second secondary winding of said driver transformer, a plate connected to one terminal of said load, and a cathode or filament to amplify a second AC signal generated by said second secondary winding, said second triode having a grid potential negatively biased with respect to said cathode or filament; and DC magnetization control means for providing a predetermined magnetization control current to said tertiary winding of said driver transformer so as to change a degree of DC magnetization of said core of said magnetic circuit of said driver transformer, wherein a DC magnetized state of said core of said magnetic circuit of said driver transformer magnetized by the drive-stage DC current is changed by the magnetization control current so as to obtain a predetermined state.

15. A transformer-coupled amplifier comprising:

a driver transformer in which a primary winding, a first secondary winding, a second secondary winding, and a tertiary winding are wound on a core of a magnetic circuit;

a drive signal source for-supplying an AC drive signal superposed with a drive-stage DC current to said primary winding of said driver transformer;

a first triode having a grid connected to said first secondary winding of said driver transformer, a plate connected to one terminal of a load, and a cathode or filament to amplify a first AC signal generated by said first secondary winding, said first triode having a grid potential positively biased with respect to said cathode or filament;

a second triode having a grid connected to said second secondary winding of said driver transformer, a plate connected to one terminal of said load, and a cathode or filament to amplify a second AC signal generated by said second secondary winding, said second triode having a grid potential positively biased with respect to said cathode or filament; and DC magnetization control means for providing a predetermined magnetization control current to said tertiary winding of said driver transformer so as to change a degree of DC magnetization of said core of said magnetic circuit of said driver transformer, wherein a DC magnetized state of said core of said magnetic circuit of said driver transformer magnetized by the drive-stage DC current is changed by the magnetization control current so as to obtain a predetermined state.

16. A transformer-coupled amplifier comprising:

a driver transformer in which a primary winding, a first secondary winding, a second secondary winding, and a tertiary winding are wound on a core of a magnetic circuit;

a drive signal source for supplying an AC drive signal superposed with a drive-stage DC current to said primary winding of said driver transformer;

a first transistor having a base connected to said first secondary winding of said driver transformer, an emitter connected to a load, and a collector connected to one terminal of a power source to amplify a first AC signal generated by said first secondary winding;

a second transistor having a base connected to said second secondary winding of said driver transformer, an emitter connected to said load, and a collector connected to the other terminal of said power source to amplify a second AC signal generated by said second secondary winding; and DC magnetization control means for providing a predetermined magnetization control current to said tertiary winding of said driver transformer so as to change a degree of DC magnetization of said core of said magnetic circuit of said driver transformer, wherein a DC magnetized state of said core of said magnetic circuit of said driver transformer magnetized by the drive-stage DC current is changed by the magnetization control current so as to obtain a predetermined state.

17. A transformer-coupled amplifier comprising:

a driver transformer in which a primary winding, a first secondary winding, a second secondary winding, and a tertiary winding are wound on a core of a magnetic circuit;

a drive signal source for supplying an AC drive signal superposed with a drive-stage DC current to said primary winding of said driver transformer;

a first field effect transistor having a gate connected to said first secondary winding of said driver transformer, a source connected to a load, and a drain connected to one terminal of a power source to amplify a first AC signal generated by said first secondary winding;

a second field effect transistor having a gate connected to said second secondary winding of said driver transformer, a source connected to said load, and a drain connected to the other terminal of said power source to amplify a second AC signal generated by said second secondary winding; and DC magnetization control means for providing a predetermined magnetization control current to said tertiary winding of said driver transformer so as to change a degree of DC magnetization of said core of said magnetic circuit of said driver transformer, wherein a DC magnetized state of said core of said magnetic circuit of said driver transformer magnetized by the drive-stage DC current is changed by the magnetization control current so as to obtain a predetermined state.

18. A transformer-coupled amplifier comprising:

a driver transformer in which a primary winding, a first secondary winding, a second secondary winding, a third secondary winding, a fourth secondary winding, and a tertiary winding are wound on a core of a magnetic circuit;

a drive signal source for supplying an AC drive signal superposed with a drive-stage DC current to said primary winding of said driver transformer;

a first field effect transistor having a gate connected to said first secondary winding of said driver transformer, a source connected to a load, and a drain connected to one terminal of a power source to amplify a first AC signal generated by said first secondary winding;

a second field effect transistor having a gate connected to said second secondary winding of said driver transformer, a source connected to said load, and a drain connected to the other terminal of said power source to amplify a second AC signal generated by said second secondary winding;

a third field effect transistor having a gate connected to said third secondary winding of said driver transformer, a source connected to said load, and a drain connected to one terminal of said power source to amplify a third AC signal generated by said third secondary winding;

a fourth field effect transistor having a gate connected to said fourth secondary winding of said driver transformer, a source connected to said load, and a drain connected to the other terminal of said power source to amplify a fourth AC signal generated by said fourth secondary winding; and DC magnetization control means for providing a predetermined magnetization control current to said tertiary winding of said driver transformer so as to change a degree of DC magnetization of said core of said magnetic circuit of said driver transformer, wherein a DC magnetized state of said core of said magnetic circuit of said driver transformer magnetized by the drive-stage DC current is changed by the magnetization control current so as to obtain a predetermined state.

* * * * *